(12) United States Patent
Lue

(10) Patent No.: US 8,630,114 B2
(45) Date of Patent: Jan. 14, 2014

(54) MEMORY ARCHITECTURE OF 3D NOR ARRAY

(75) Inventor: Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 390 days.

(21) Appl. No.: 13/045,975

(22) Filed: Mar. 11, 2011

(65) Prior Publication Data

US 2012/0182801 A1  Jul. 19, 2012

Related U.S. Application Data

(60) Provisional application No. 61/434,221, filed on Jan. 19, 2011.

(51) Int. Cl.
*G11C 11/40* (2006.01)

(52) U.S. Cl.
USPC ............... 365/185.05; 365/185.17; 365/63; 257/324

(58) Field of Classification Search
USPC .......... 365/63, 185.17, 185.05; 257/324, 325, 257/326, E29.309, 319, 321
See application file for complete search history.

(56) References Cited

U.S. PATENT DOCUMENTS

| | | | |
|---|---|---|---|
| 6,034,882 A | 3/2000 | Johnson et al. | |
| 6,486,027 B1 * | 11/2002 | Noble et al. | 438/259 |
| 6,593,624 B2 * | 7/2003 | Walker | 257/344 |
| 6,906,940 B1 | 6/2005 | Lue | |
| 7,081,377 B2 | 7/2006 | Cleeves | |
| 7,129,538 B2 | 10/2006 | Lee et al. | |
| 7,177,169 B2 | 2/2007 | Scheuerlein | |
| 7,646,041 B2 * | 1/2010 | Chae et al. | 257/204 |
| 7,948,024 B2 * | 5/2011 | Kim et al. | 257/318 |
| 8,154,128 B2 * | 4/2012 | Lung | 257/758 |
| 8,331,149 B2 * | 12/2012 | Choi et al. | 365/185.05 |
| 2001/0055838 A1 * | 12/2001 | Walker et al. | 438/129 |
| 2002/0028541 A1 * | 3/2002 | Lee et al. | 438/149 |
| 2005/0280061 A1 | 12/2005 | Lee | |
| 2007/0158736 A1 * | 7/2007 | Arai et al. | 257/315 |
| 2008/0101109 A1 | 5/2008 | Haring-Bolivar et al. | |
| 2009/0097321 A1 | 4/2009 | Kim et al. | |
| 2009/0184360 A1 | 7/2009 | Jin et al. | |
| 2010/0270593 A1 | 10/2010 | Lung et al. | |

FOREIGN PATENT DOCUMENTS

| | | |
|---|---|---|
| EP | 1936681 A1 | 6/2008 |
| EP | 2048709 A2 | 4/2009 |

OTHER PUBLICATIONS

Soon-Moon Jung et al. "Three Dimensionally Stacked NAND Flash Memory Technology Using Stacking Single Crystal Si Layers on ILD and TANOS Structure for Beyond 30 nm Node," Electron Devices Meeting, 2006, IEDM International, Dec. 11-13, 2006, pp. 1-4.

(Continued)

*Primary Examiner* — Douglas King
(74) *Attorney, Agent, or Firm* — Kenta Suzue; Haynes Beffel & Wolfeld LLP

(57) ABSTRACT

A 3D memory device includes a plurality of ridge-shaped stacks of memory cells. Word lines are arranged over the stacks of memory cells. Bit lines structures are coupled to multiple locations along the stacks of memory cells. Source line structures are coupled to multiple locations along each of the semiconductor material strips of the stacks. The bit line structures and the source line structures are between adjacent ones of the word lines.

18 Claims, 15 Drawing Sheets

(56) References Cited

OTHER PUBLICATIONS

Jiyoung Kim et al., Novel 3-D Structure for Ultra High Density Flash Memory with VRAT (Vertical-Recess-Array-Transistor) and PIPE (Planarized Integration on the same PlanE), 2008 Symposium on VLSI Technology Digest of Technical Papers, pp. 122-123.

Mark Johnson et al. "512-Mb PROM With a Three-Dimensional Array of Diode/Antifuse Memory Cells," IEEE Journal of Solid-State Circuits, vol. 38, No. 11, Nov. 2003, pp. 1920-1928.

Erh-Kun Lai et al. "A Multi-Layer Stackable Thin-Film Transistor (TFT) NAND-Type Flash Memory," 2006 IEEE, pp. 1-4.

H. Tanaka et al. "Bit Cost Scalable Technology with Punch and Plug Process for Ultra High Density Flash Memory," Jun. 12-14, 2007, Symposium on VLSI Technology Digest of Technical Papers, pp. 14-15.

Tzu-Hsuan Hsu et al. "Study of Sub-30nm Thin Film Transistor (TFT) Charge-Trapping (CT) Devices for 3D NAND Flash Application," IEEE 2009, pp. 27.4.1-27.4.4.

A. Hubert et al. "A Stacked SONOS Technology, Up to 4 Levels and 6nm Crystalline Nanowires, With Gate-All-Around or Independent Gates (Flash), Suitable for Full 3D Integration," IEDM 2009, pp. 27.6.1-27.6.4.

Hang-Ting Lue et al. "A Novel Buried-Channel FinFET BE-SONOS NAND Flash with Improved Memory Window and Cycling Endurance," 2009 Symposium on VLSI Technology Digest of Technical Papers, pp. 224-225.

Wonjoo Kim et al. "Multi-Layered Vertical Gate NaAND Flash Overcoming Stacking Limit for Terabit Density Storage," 2009 Symposium on VLSI Technology Digest of Technical Papers, pp. 188-189.

Jaehoon Jang et al. "Vertical Cell Array Using TCAT (Terabit Cell Array Transistor) Technology for Ultra High Density NAND Flash Memory," 2009 Symposium on VLSI Technology Digest of Technical Papers, pp. 192-193.

Ryota Katsumata et al. "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Bipul C. Paul et al. "Impact of a Process Variation on Nanowire and Nanotube Device Performance," IEEE Transactions on Electron Devices, vol. 54, No. 9, Sep. 2007, pp. 2369-2376.

Sung-Jin Choi et al. "Performance Breakthrough in NOR Flash Memory With Dopant-Segregated Schottky-Barrier (DSSB) SONOS Devices," 2009 Symposium on VLSI Technology Digest of Technical Papers, pp. 222-223.

Sheng-Chih Lai et al. "Highly Reliable MA BE-SONOS (Metal-Al2O3 Bandgap Engineered SONOS) Using a SiO2 Buffer Layer," VLSI Technology, Systems and Applications 2008, VLSI-TSA International Symposium on Apr. 21-23, 2008, pp. 58-59.

\* cited by examiner

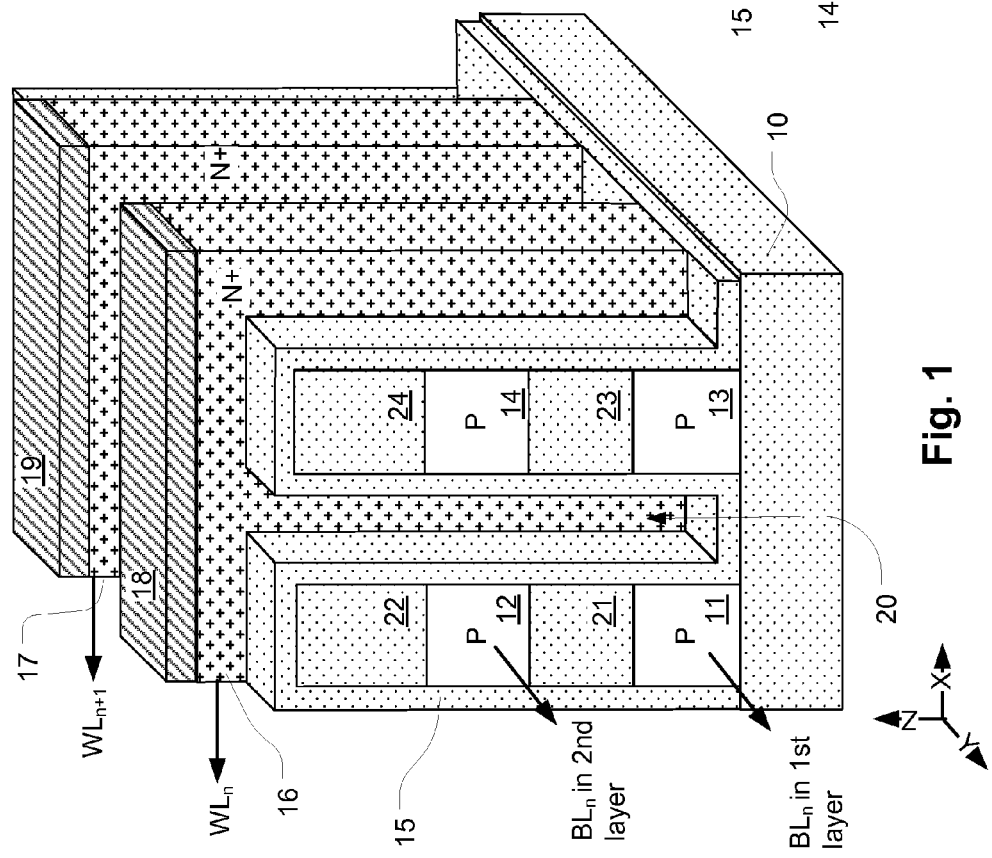
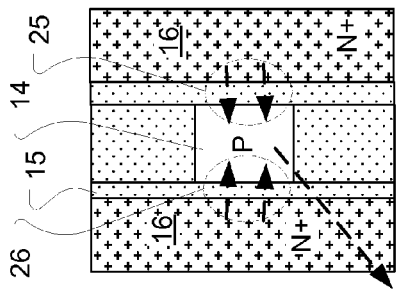
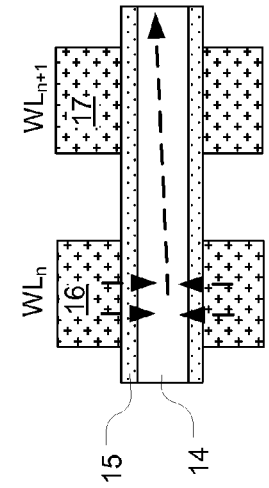

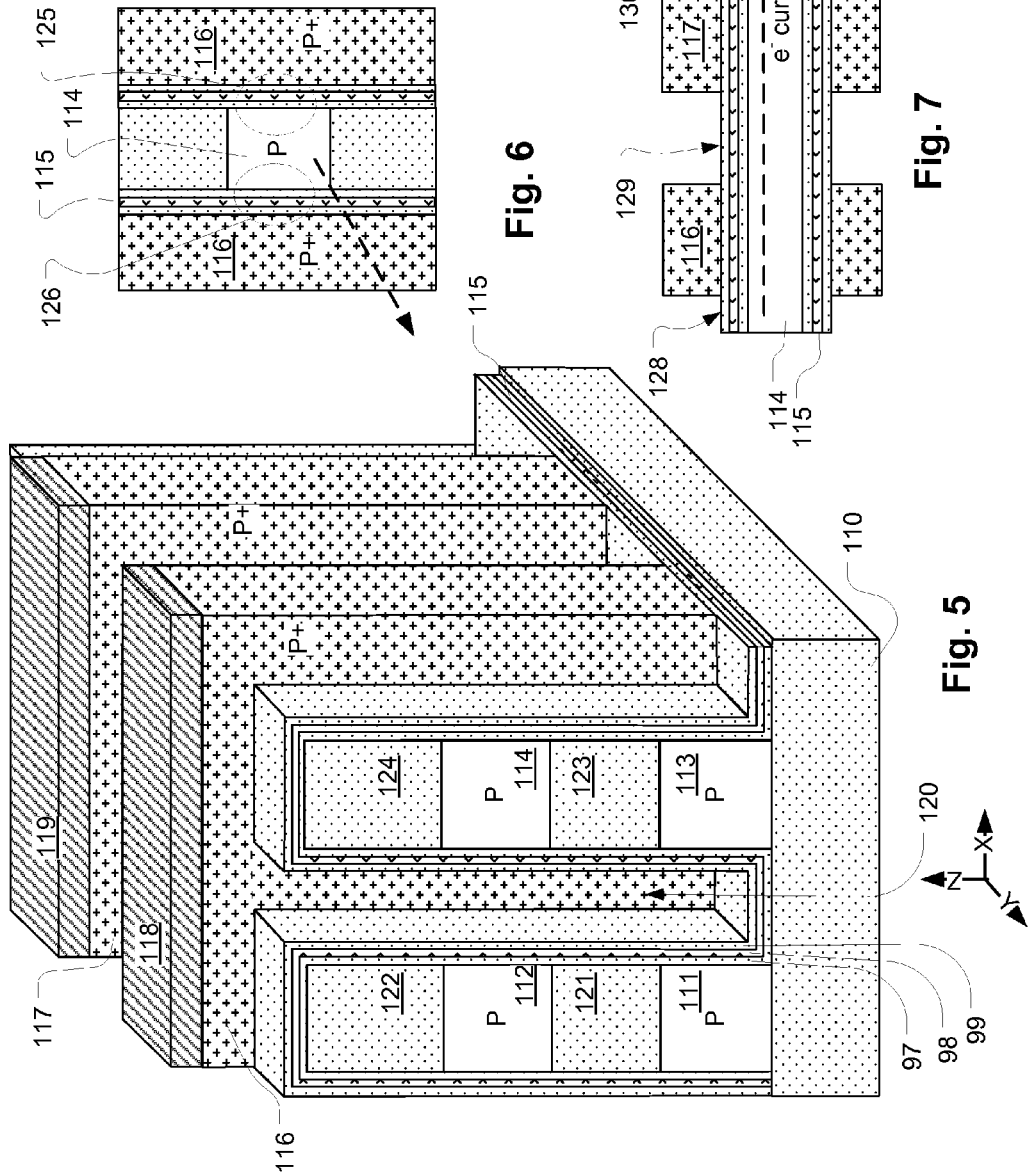

MEMORY ARCHITECTURE OF 3D NOR ARRAY

REFERENCE TO RELATED APPLICATION

This application claims the benefit of U.S. Provisional Application No. 61/434,221, filed on 19 Jan. 2011 and is incorporated herein by reference.

BACKGROUND OF THE INVENTION

1. Field of the Invention

The present invention relates to high density memory devices, and particularly to memory devices in which multiple planes of memory cells are arranged to provide a three-dimensional 3D array.

2. Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node", IEEE Int'l Electron Devices Meeting, 11-13 Dec. 2006.

Also, cross-point array techniques have been applied for anti-fuse memory in Johnson et al., "512-Mb PROM With a Three-Dimensional Array of Diode/Anti-fuse Memory Cells" IEEE J. of Solid-State Circuits, vol. 38, no. 11, November 2003. In the design described in Johnson et al., multiple layers of word lines and bit lines are provided, with memory elements at the cross-points. The memory elements comprise a p+ polysilicon anode connected to a word line, and an n-polysilicon cathode connected to a bit line, with the anode and cathode separated by anti-fuse material.

In the processes described in Lai, et al., Jung, et al. and Johnson et al., there are several critical lithography steps for each memory layer. Thus, the number of critical lithography steps needed to manufacture the device is multiplied by the number of layers that are implemented. So, although the benefits of higher density are achieved using 3D arrays, the higher manufacturing costs limit the use of the technology.

Another structure that provides vertical NAND cells in a charge trapping memory technology is described in Tanaka et al., "Bit Cost Scalable Technology with Punch and Plug Process for Ultra High Density Flash Memory", 2007 Symposium on VLSI Technology Digest of Technical Papers; 12-14 Jun. 2007, pages: 14-15. The structure described in Tanaka et al. includes a multi-gate field effect transistor structure having a vertical channel which operates like a NAND gate, using silicon-oxide-nitride-oxide-silicon SONOS charge trapping technology to create a storage site at each gate/vertical channel interface. The memory structure is based on a pillar of semiconductor material arranged as the vertical channel for the multi-gate cell, with a lower select gate adjacent the substrate, and an upper select gate on top. A plurality of horizontal control gates is formed using planar electrode layers that intersect with the pillars. The planar electrode layers used for the control gates do not require critical lithography, and thereby save costs. However, many critical lithography steps are required for each of the vertical cells. Also, there is a limit in the number of control gates that can be layered in this way, determined by such factors as the conductivity of the vertical channel, program and erase processes that are used and so on.

It is desirable to provide a structure for three-dimensional integrated circuit memory with a low manufacturing cost, including reliable, very small memory elements and improved process window associated with neighboring stacks of memory cell strings having gate structures.

SUMMARY OF THE INVENTION

In various embodiments, the memory architecture implements a 3D NOR array.

The 3D memory device includes a plurality of ridge-shaped stacks, in the form of multiple strips of semiconductor material separated by insulating material, arranged in the examples described herein as memory cell strings which can be coupled through decoding circuits to sense amplifiers.

The strips of semiconductor material have side surfaces on the sides of the ridge-shaped stacks. A plurality of word lines, which can be coupled to row decoders, extends orthogonally over the plurality of ridge-shaped stacks. Memory elements lie between the surfaces of the stacks and the word lines. The memory elements are programmable and nonvolatile, like the programmable resistance structures or charge trapping structures in the embodiments described below, or programmable and volatile, also described below. The combination of the conformal word line, the memory element and the semiconductor strips within a stack forms a stack of memory cells. As a result of the array structure, a 3D array of memory cells is provided.

A plurality of bit line structures is coupled to multiple locations along each of the semiconductor material strips of the plurality of stacks. Also, a plurality of source line structures is coupled to multiple locations along each of the semiconductor material strips of the plurality of stacks. The plurality of bit line structures and the plurality of source line structures are between adjacent ones of the plurality of word lines. Many embodiments are referred to as a NOR arrangement.

The plurality of ridge-shaped stacks and the plurality of word lines can be made so that the memory cells are self-aligned. For example, the plurality of semiconductor strips in the ridge-shaped stack can be defined using a single etch mask, resulting in formation of alternating trenches, which can be relatively deep, and stacks in which the side surfaces of the semiconductor strips are vertically aligned or aligned on tapered sides of the ridges that result from the etch. The memory elements can be formed using a layer or layers of material made with blanket deposition processes over the plurality of stacks, and using other processes without a critical alignment step. Also, the plurality of word lines can be formed using a conformal deposition over the layer or layers of material used to provide the memory elements, followed by an etch process to define the lines using a single etch mask. As a result, a 3D array of self-aligned memory cells is established using only one alignment step for the semiconductor strips in the plurality of stacks, and one alignment step for the plurality of word lines.

A combined selection of a particular bit line of a plurality of bit lines, a particular source line of the plurality of source lines, and a particular word line of the plurality of word lines, identifies a particular memory element.

Many embodiments comprise diodes proximate to the plurality of bit line structures. Such diodes prevent stray currents from flowing in underside paths such as unselected bit lines. In one embodiment, the semiconductor material strips comprise n-type silicon of the diodes, and the diodes comprise a p-type region in the strips. In another embodiment, the semiconductor material strips comprise n-type silicon of the diodes, and the diodes comprise a p-type plug in contact with the semiconductor material strips.

Some embodiments comprise staircase structures coupling the plurality of source line structures to a plurality of source lines.

Another aspect of the technology is a memory device, comprising an integrated circuit substrate, a 3D array of memory cells on the integrated circuit substrate and including stacks of NOR memory cells, a plurality of word lines arranged over the stacks of NOR memory cells, a plurality of bit lines structures coupled to multiple locations along the stacks of NOR memory cells, and a plurality of source line structures coupled to multiple locations along each of the semiconductor material strips of the plurality of stacks. The plurality of bit line structures and the plurality of source line structures are between adjacent ones of the plurality of word lines.

Another aspect of the technology is a memory device is a method of operating a 3D memory array, comprising:
 biasing adjacent stacks of NOR memory cells in a 3D array, including
  biasing bit lines coupled via diodes to multiple locations along the stacks of NOR memory cells.

Other aspects and advantages of the present invention can be seen on review of the drawings, the detailed description and the claims, which follow.

BRIEF DESCRIPTION OF THE DRAWINGS

FIG. 1 is a perspective illustration of a 3D memory structure as described herein including a plurality of planes of semiconductor strips parallel to a Y-axis, arranged in a plurality of ridge-shaped stacks, a memory layer on side surfaces of the semiconductor strips, and a plurality of word lines with conformal bottom surfaces arranged over the plurality of ridge-shaped stacks.

FIG. 2 is a cross-section of a memory cell taken in the X-Z plane from the structure of FIG. 1.

FIG. 3 is a cross-section of a memory cell taken in the X-Y plane from the structure of FIG. 1.

FIG. 5 is a perspective illustration of a 3D NOR-flash memory structure as described herein including a plurality of planes of semiconductor strips parallel to a Y-axis, arranged in a plurality of ridge-shaped stacks, a charge trapping memory layer on side surfaces of the semiconductor strips, and a plurality of word lines with conformal bottom surfaces arranged over the plurality of ridge-shaped stacks.

FIG. 6 is a cross-section of a memory cell taken in the X-Z plane from the structure of FIG. 5.

FIG. 7 is a cross-section of a memory cell taken in the X-Y plane from the structure of FIG. 5.

DETAILED DESCRIPTION

Figure 4:
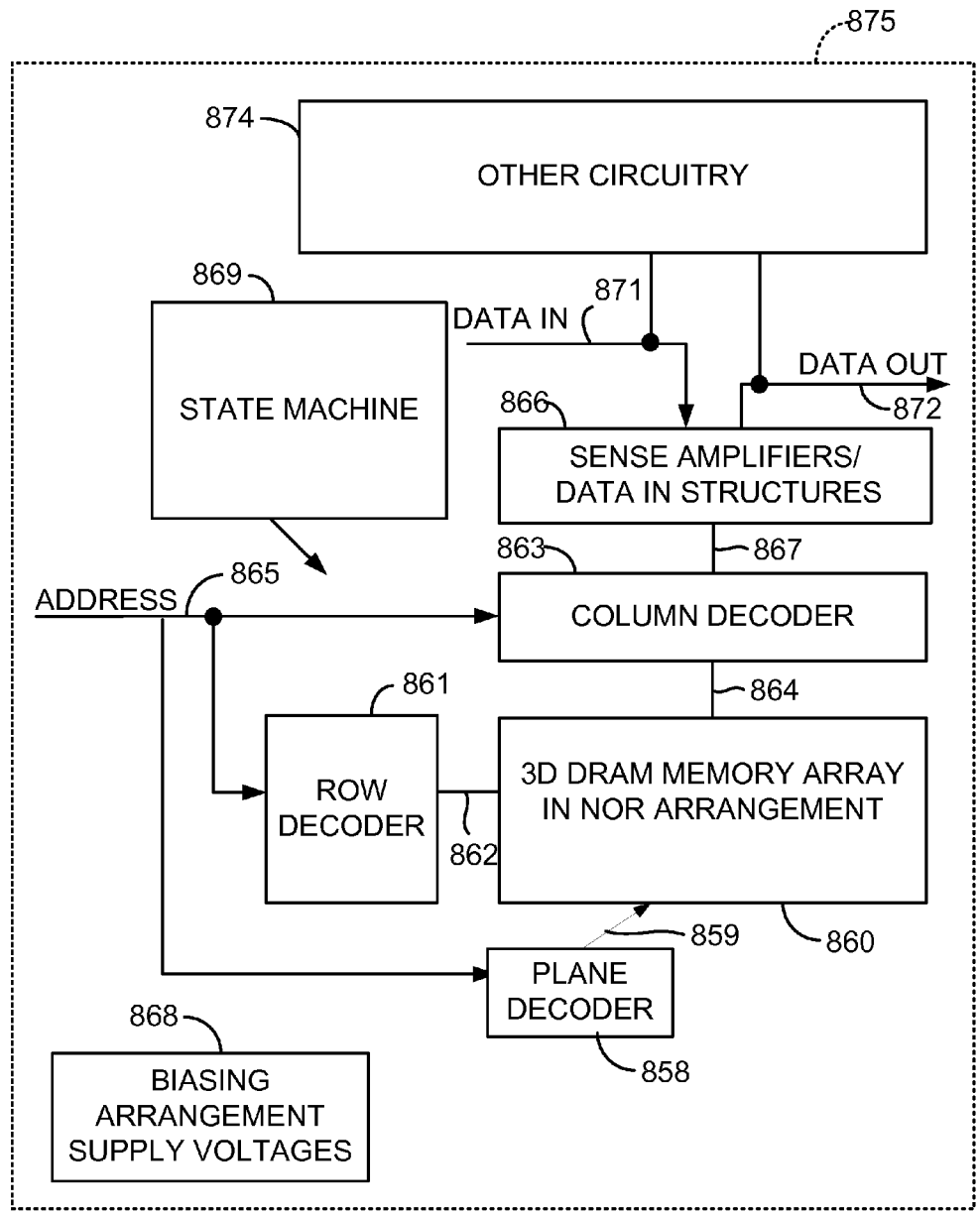
FIG. 4 is a schematic diagram of an integrated circuit including a 3D transient memory array with row, column and plane decoding circuitry.

A detailed description of embodiments is provided with reference to the FIGS. 1-51.

FIG. 1 is a perspective drawing of a 2×2 portion of a three-dimensional programmable resistance memory array with fill material removed from the drawing to give a view of the stacks of semiconductor strips and orthogonal word lines that make up the 3D array. In this illustration, only 2 planes are shown. However, the number of planes can be extended to very large numbers. As shown in FIG. 1, the memory array is formed on an integrated circuit substrate having an insulating layer 10 over underlying semiconductor or other structures (not shown). The memory array includes a plurality of stacks of semiconductor strips 11, 12, 13, 14 separated by insulating material 21, 22, 23, 24. The stacks are ridge-shaped extending on the Y-axis as illustrated in the figure, so that the semiconductor strips 11-14 can be configured as memory cell strings. Semiconductor strips 11 and 13 can act as memory cell strings in a first memory plane. Semiconductor strips 12 and 14 can act as memory cell strings in a second memory plane. A layer 15 of memory material, such as a transient memory material, coats the plurality of stacks of semiconductor strips in this example, and at least on the side walls of the semiconductor strips in other examples. A plurality of word lines 16, 17 is arranged orthogonally over the plurality of stacks of semiconductor strips. The word lines 16, 17 have surfaces conformal with the plurality of stacks of semiconductor strips, filling the trenches (e.g. 20) defined by the plurality of stacks, and defining a multi-layer array of interface regions at cross-points between side surfaces of the semiconductor strips 11-14 on the stacks and word lines 16, 17. A layer of silicide (e.g. tungsten silicide, cobalt silicide, titanium silicide) 18, 19 can be formed over the top surfaces of the word lines 16, 17.

In one embodiment, the layer 15 of memory material can consist of a transient memory material such as a thin gate oxide (<5 nm) such that the device is a 1T MOSFET with a floating body. This can be used as a DRAM (dynamic random access memory).

In another embodiment, the layer 15 of memory material can consist of an anti-fuse material such as a silicon dioxide, silicon oxynitride or other silicon oxide, for example having a thickness on the order of 1 to 5 nanometers. Other anti-fuse materials may be used, such as silicon nitride.

The semiconductor strips 11-14 can be a semiconductor material with a first conductivity type (e.g. p-type). The word lines 16, 17 can be a semiconductor material with a second conductivity type (e.g. n-type). For example, the semiconductor strips 11-14 can be made using p-type polysilicon while the word lines 16, 17 can be made using relatively heavily doped n+-type polysilicon. The width of the semiconductor strips should be enough to provide room for a depletion region to support the diode operation. As result, memory cells comprising a rectifier formed by the p-n junction with a memory material layer in between the anode and cathode are formed in the 3D array of cross-points between the polysilicon strips and lines. In other embodiments, different memory materials can be used, including transition metal oxides like tungsten oxide on tungsten or doped metal oxide semiconductor strips. Such materials can be programmed and erased, and can be implemented for operations storing multiple bits per cell.

FIG. 2 shows a cross-section view cut in the X-Z plane of the memory cell formed at the intersection of word line 16 and semiconductor strip 14. Active regions 25, 26 are formed on both sides of the strip 14 between the word line 16 and the strip 14.

With a DRAM application, a layer 15 has transient memory material. After programming such as by CHE (channel hot electron) programming, impact ionization generates holes in the substrate for a short time.

With a programmable resistive memory application, in the native state, a layer 15 of transient memory material anti-fuse material has a high resistance. After programming, the anti-fuse material breaks down, causing one or both of the active areas 25, 26 within the anti-fuse material to assume a low resistance state.

In the embodiment described here, each memory cell has two active regions 25, 26, one on each side of the semiconductor strip 14. FIG. 3 shows a cross-section view in the X-Y plane of the memory cell formed at the intersection of the word lines 16, 17 and the semiconductor strip 14. The current path from the word line defined by the word line 16 through the layer 15 of memory material and down the semiconductor strip 14 is illustrated.

Electron current as illustrated by the solid arrows in FIG. 3, flows from the n+ word lines 16 into the p-type semiconductor strips, and along the semiconductor strip (- -arrow) to sense amplifiers where it can be measured to indicate the state of a selected memory cell A typical transient memory bias is discussed below in connection with the 3D perspective figures, and discussed programming such as by CHE (channel hot electron) programming to generate impact ionization.

In a typical programmable resistive memory embodiment, using a layer of silicon oxide about one nanometer thick as the anti-fuse material, a programming pulse may comprise a 5 to 7 volt pulse having a pulse width of about one microsecond, applied under control of on-chip control circuits as described below with reference to FIG. 18. A read pulse may comprise a 1 to 2 volt pulse having a pulse width that depends on the configuration, applied under control of on-chip control circuits. The read pulse can be much shorter than the programming pulse.

FIG. 4 is a simplified block diagram of an integrated circuit according to an embodiment of the present invention. The integrated circuit line 875 includes a 3D dynamic random access memory array 860 DRAM in a NOR arrangement implemented as described herein, on a semiconductor substrate. Another embodiment is a programmable resistance memory array 860 (RRAM). A row decoder 861 is coupled to a plurality of word lines 862, and arranged along rows in the memory array 860. A column decoder 863 is coupled to bit lines 864 arranged along columns corresponding to stacks in the memory array 860 for reading and programming data from the memory cells in the array 860. A plane decoder 858 is coupled via source lines 859 to a plurality of planes in the memory array 860. Addresses are supplied on bus 865 to column decoder 863, row decoder 861 and plane decoder 858. Sense amplifiers and data-in structures in block 866 are coupled to the column decoder 863 in this example via data bus 867. Data is supplied via the data-in line 871 from input/output ports on the integrated circuit 875 or from other data sources internal or external to the integrated circuit 875, to the data-in structures in block 866. In the illustrated embodiment, other circuitry 874 is included on the integrated circuit, such as a general purpose processor or special purpose application circuitry, or a combination of modules providing system-on-a-chip functionality supported by the memory array. Data is supplied via the data-out line 872 from the sense amplifiers in block 866 to input/output ports on the integrated circuit 875, or to other data destinations internal or external to the integrated circuit 875.

A controller implemented in this example using bias arrangement state machine 869 controls the application of bias arrangement supply voltage generated or provided through the voltage supply or supplies in block 868, such as read and program voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

FIG. 5 is a perspective drawing of a 2×2 portion of a three-dimensional charge trapping memory array with fill material removed from the drawing to give a view of the stacks of semiconductor strips and orthogonal word lines that make up the 3D array. In this illustration, only 2 layers are shown. However, the number of layers can be extended to very large numbers. As shown in FIG. 5, the memory array is formed on an integrated circuit substrate having an insulating layer 110 over underlying semiconductor or other structures (not shown). The memory array includes a plurality of stacks (2 are shown in the drawing) of semiconductor strips 111, 112, 113, 114 separated by insulating material 121, 122, 123, 124. The stacks are ridge-shaped extending on the Y-axis as illustrated in the figure, so that the semiconductor strips 111-114 can be configured as memory cell strings. Semiconductor strips 111 and 113 can act as memory cell strings in a first memory plane. Semiconductor strips 112 and 114 can act as memory cell strings in a second memory plane.

The insulating material 121 between the semiconductor strips 111 and 112 in a first stack and the insulating material 123 between semiconductor strips 113 and 114 in the second stack has an effective oxide thickness of about 40 nm or greater, where effective oxide thickness EOT is a thickness of the insulating material normalized according to a ratio of the dielectric constant of silicon dioxide and the dielectric constant of the chosen insulation material. The term "about 40 nm" is used here to account for variations on the order of 10% or so, as arise typically in manufacturing structures of this type. The thickness of the insulating material can play a critical role in reducing interference between cells in adjacent layers of the structure. In some embodiments, the EOT of the insulating material can be as small as 30 nm while achieving sufficient isolation between the layers.

A layer 115 of memory material, such as a dielectric charge trapping structure, coats the plurality of stacks of semiconductor strips in this example. A plurality of word lines 116, 117 is arranged orthogonally over the plurality of stacks of semiconductor strips. The word lines 116, 117 have surfaces conformal with the plurality of stacks of semiconductor strips, filling the trenches (e.g. 120) defined by the plurality of stacks, and defining a multi-layer array of interface regions at cross-points between side surfaces of the semiconductor strips 111-114 on the stacks and word lines 116, 117. A layer of silicide (e.g. tungsten silicide, cobalt silicide, titanium silicide) 118, 119 can be formed over the top surfaces of the word lines 116, 117.

Nanowire MOSFET type cells can also be configured in this manner, by providing nanowire or nanotube structures in channel regions on word lines 111-114, like those described in Paul, et al., "Impact of a Process Variation on Nanowire and Nanotube Device Performance", IEEE Transactions on Electron Devices, Vol. 54, No. 9, September 2007, which article is incorporated by reference as if fully set forth herein.

As a result, a 3D array of SONOS-type memory cells configured in a NOR flash array can formed. The source, drain and channel are formed in the silicon (S) semiconductor strips 111-114, the layer 115 of the memory material includes a tunneling dielectric layer 97 which can be formed of silicon oxide (O), a charge storage layer 98 which can be formed of silicon nitride (N), a blocking dielectric layer 99 which can be formed of silicon oxide (O), and the gate comprises polysilicon (S) of the word lines 116, 117.

The semiconductor strips 111-114 can be a p-type semiconductor material. The word lines 116, 117 can be a semiconductor material with the same or a different conductivity type (e.g. p+-type). For example, the semiconductor strips 111-114 can be made using p-type polysilicon, or p-type epitaxial single crystal silicon, while the word lines 116, 117 can be made using relatively heavily doped p+-type polysilicon.

Alternatively, the semiconductor strips 111-114 can be n-type semiconductor material. The word lines 116, 117 can be a semiconductor material with the same or a different conductivity type (e.g. p+-type). This n-type strip arrangement results in buried-channel, depletion mode charge trapping memory cells. For example, the semiconductor strips 111-114 can be made using n-type polysilicon, or n-type epitaxial single crystal silicon, while the word lines 116, 117 can be made using relatively heavily doped p+-type polysilicon. A typical doping concentration for n-type semiconductor strips can be around $10^{18}/cm^3$, with usable embodiments likely in the range of $10^{17}/cm^3$ to $10^{19}/cm^3$. The use of n-type semiconductor strips can be particularly beneficial in junction-free embodiments to improve conductivity along the NOR memory and thereby allowing higher read current.

Thus, memory cells comprising field effect transistors having charge storage structures are formed in the 3D array of cross-points. Using dimensions for the widths of the semiconductor strips and word lines on the order of 25 nanometers, with gaps between the ridge-shaped stacks on the order of 25 nanometers, a device having a few tens of layers (e.g. 32 layers) can approach terabit capacity ($10^{12}$) in a single chip.

The layer 115 of memory material can comprise other charge storage structures. For example, a bandgap engineered SONOS (BE-SONOS) charge storage structure can be used which includes a dielectric tunneling layer 97 that includes a composite of materials forming an inverted "U" shaped valence band under zero bias. In one embodiment, the composite tunneling dielectric layer includes a first layer referred to as a hole tunneling layer, a second layer referred to as a band offset layer, and a third layer referred to as an isolation layer. The hole tunneling layer of the layer 115 in this embodiment comprises silicon dioxide on the side surface of the semiconductor strips formed for example using in-situ steam generation ISSG with optional nitridation by either a post deposition NO anneal or by addition of NO to the ambient during deposition. The thickness of the first layer of silicon dioxide is less than 20 Å, and preferably 15 Å or less. Representative embodiments can be 10 Å or 12 Å thick.

The band offset layer in this embodiment comprises silicon nitride lying on the hole tunneling layer, formed for example using low-pressure chemical vapor deposition LPCVD, using for example dichlorosilane DCS and $NH_3$ precursors at 680° C. In alternative processes, the band offset layer comprises silicon oxynitride, made using a similar process with an $N_2O$ precursor. The band offset layer thickness of silicon nitride is less than 30 Å, and preferably 25 Å or less.

The isolation layer in this embodiment comprises silicon dioxide, lying on the band offset layer of silicon nitride formed for example using LPCVD high temperature oxide HTO deposition. The thickness of the isolation layer of silicon dioxide is less than 35 Å, and preferably 25 Å or less. This three-layer tunneling layer results in an inverted U-shaped valence band energy level.

The valence band energy level at the first location is such that an electric field sufficient to induce hole tunneling through the thin region between the interface with the semiconductor body and the first location, is also sufficient to raise the valence band energy level after the first location to a level that effectively eliminates the hole tunneling barrier in the composite tunneling dielectric after the first location. This structure establishes an inverted U-shaped valence band energy level in the three-layer tunneling dielectric layer, and enables electric field assisted hole tunneling at high speeds while effectively preventing charge leakage through the composite tunneling dielectric in the absence of electric fields or in the presence of smaller electric fields induced for the purpose of other operations, such as reading data from the cell or programming adjacent cells.

In a representative device, the layer 115 of memory material includes a bandgap engineered composite tunneling dielectric layer comprising a layer of silicon dioxide less than 2 nm thick, a layer of silicon nitride less than 3 nm thick, and a layer of silicon dioxide less that 4 nm thick. In one embodiment, the composite tunneling dielectric layer consists of an ultrathin silicon oxide layer O1 (e.g. <=15 Å), an ultrathin silicon nitride layer N1 (e.g. <=30 Å) and an ultrathin silicon oxide layer O2 (e.g. <=35 Å), which results in an increase in the valence band energy level of about 2.6 eV at an offset 15 Å or less from the interface with the semiconductor body. The O2 layer separates the N1 layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the O2 layer does not significantly interfere with the electric field assisted hole tunneling, while improving the ability of the engineered tunneling dielectric to block leakage during low fields.

A charge trapping layer in the layer 115 of memory material in this embodiment comprises silicon nitride having a thickness greater than 50 Å, including for example about 70 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on.

The blocking dielectric layer in the layer 115 of memory material in this embodiment comprises a layer of silicon dioxide having a thickness greater than 50 Å, including for example about 90 Å in this embodiment, can be formed by wet conversion from the nitride by a wet furnace oxidation process. Other embodiments may be implemented using high temperature oxide (HTO) or LPCVD $SiO_2$. Other blocking dielectrics can include high-K materials like aluminum oxide.

In a representative embodiment, the hole tunneling layer can be 13 Å of silicon dioxide; the band offset layer can be 20 Å of silicon nitride; the isolation layer can be 25 Å of silicon dioxide; the charge trapping layer can be 70 Å of silicon nitride; and the blocking dielectric layer can be silicon oxide 90 Å thick. The gate material is p+ polysilicon (work function about 5.1 eV) used in the word lines 116, 117.

FIG. 6 shows a cross-section view cut in the X-Z plane of the charge trapping memory cell formed at the intersection of word line 116 and semiconductor strip 114. Active charge trapping regions 125, 126 are formed on the both sides of the strip 114 between the word lines 116 and the strip 114. In the embodiment described here, as shown in FIG. 6, each memory cell is a double gate field effect transistor having active charge storage regions 125, 126, one on each side of the semiconductor strip 114. Electron current as illustrated by the solid arrows in the diagram flows along the p-type semiconductor strips, to sense amplifiers where it can be measured to indicate the state of a selected memory cell.

FIG. 7 shows a cross-section view cut in the X-Y plane of the charge trapping memory cell formed at the intersection of the word lines 116, 117 and the semiconductor strip 114. The current path down the semiconductor strip 114 is illustrated. The source/drain regions 128, 129, 130 between the word lines 116, 117 which act as word lines can be "junction-free", without source and drain doping having a conductivity type opposite that of the channel regions beneath the word lines. In the junction free embodiment, the charge trapping field effect transistors can have a p-type channel structure. Also, source and drain doping could be implemented in some embodiments, in a self-aligned implant after word line definition.

In alternative embodiments, the semiconductor strips 111-114 can be implemented using a lightly doped n-type semiconductor body in junction free arrangements, resulting in a buried-channel field effect transistor which can operate in depletion mode, with naturally shifted lower threshold distributions for the charge trapping cells.

Figure 8:
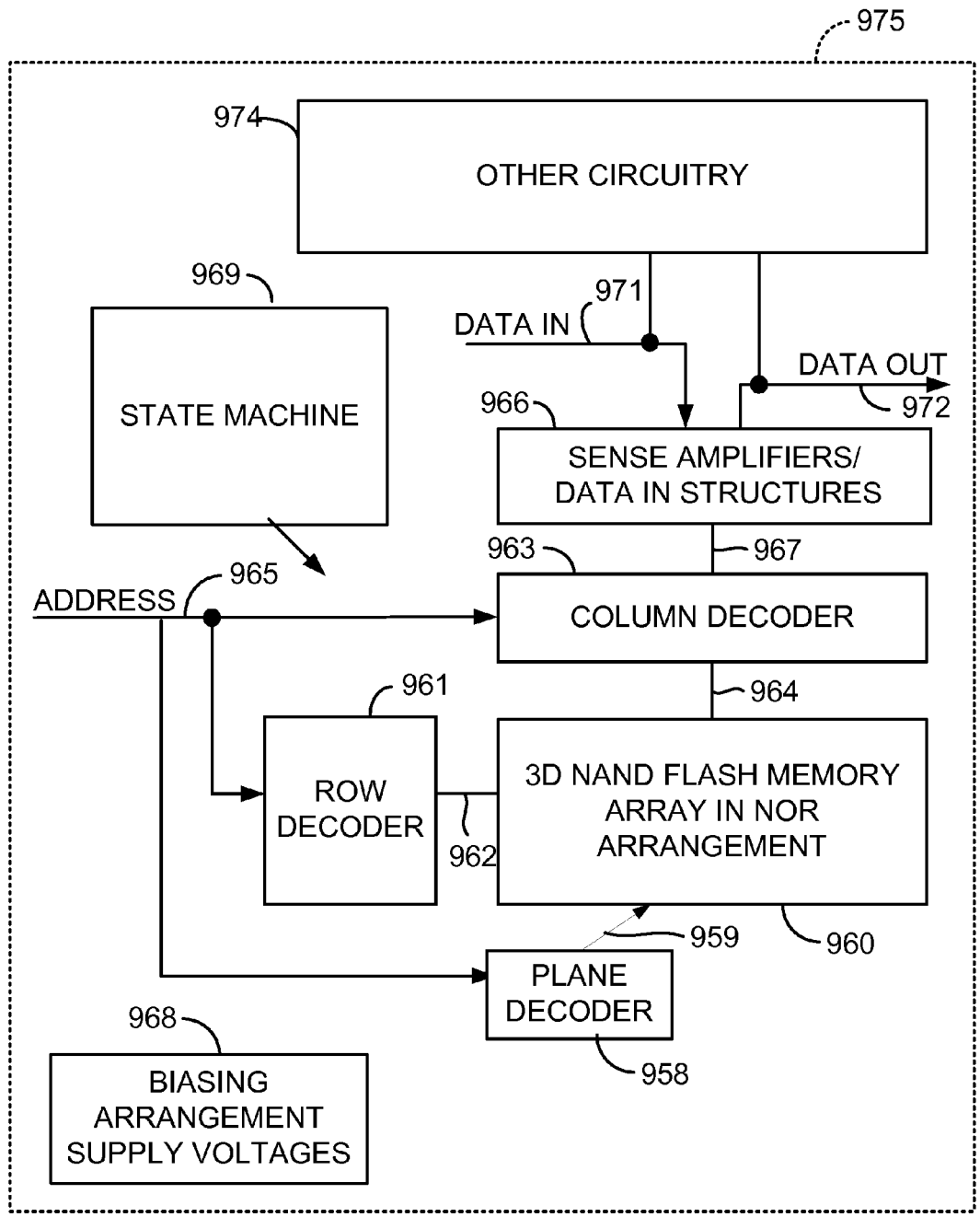
FIG. 8 is a schematic diagram of an integrated circuit including a 3D NOR-flash memory array with row, column and plane decoding circuitry.

FIG. 8 is a simplified block diagram of an integrated circuit according to an embodiment of the present invention. The integrated circuit line 975 includes a 3D flash memory array 960 in a NOR arrangement, implemented as described herein, on a semiconductor substrate. A row decoder 961 is coupled to a plurality of word lines 962, and arranged along rows in the memory array 960. A column decoder 963 is coupled to bit lines 964 arranged along columns corresponding to stacks in the memory array 960 for reading and programming data from the memory cells in the array 960. A plane decoder 958 is coupled via source lines 959 to a plurality of planes in the memory array 960 via. Addresses are supplied on bus 965 to column decoder 963, row decoder 961 and plane decoder 958. Sense amplifiers and data-in structures in block 966 are coupled to the column decoder 963 in this example via data bus 967. Data is supplied via the data-in line 971 from input/output ports on the integrated circuit 975 or from other data sources internal or external to the integrated circuit 975, to the data-in structures in block 966. In the illustrated embodiment, other circuitry 974 is included on the integrated circuit, such as a general purpose processor or special purpose application circuitry, or a combination of modules providing system-on-a-chip functionality supported by the memory cell array. Data is supplied via the data-out line 972 from the sense amplifiers in block 966 to input/output ports on the integrated circuit 975, or to other data destinations internal or external to the integrated circuit 975.

A controller implemented in this example using bias arrangement state machine 969 controls the application of bias arrangement supply voltage generated or provided through the voltage supply or supplies in block 968, such as read, erase, program, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 9:
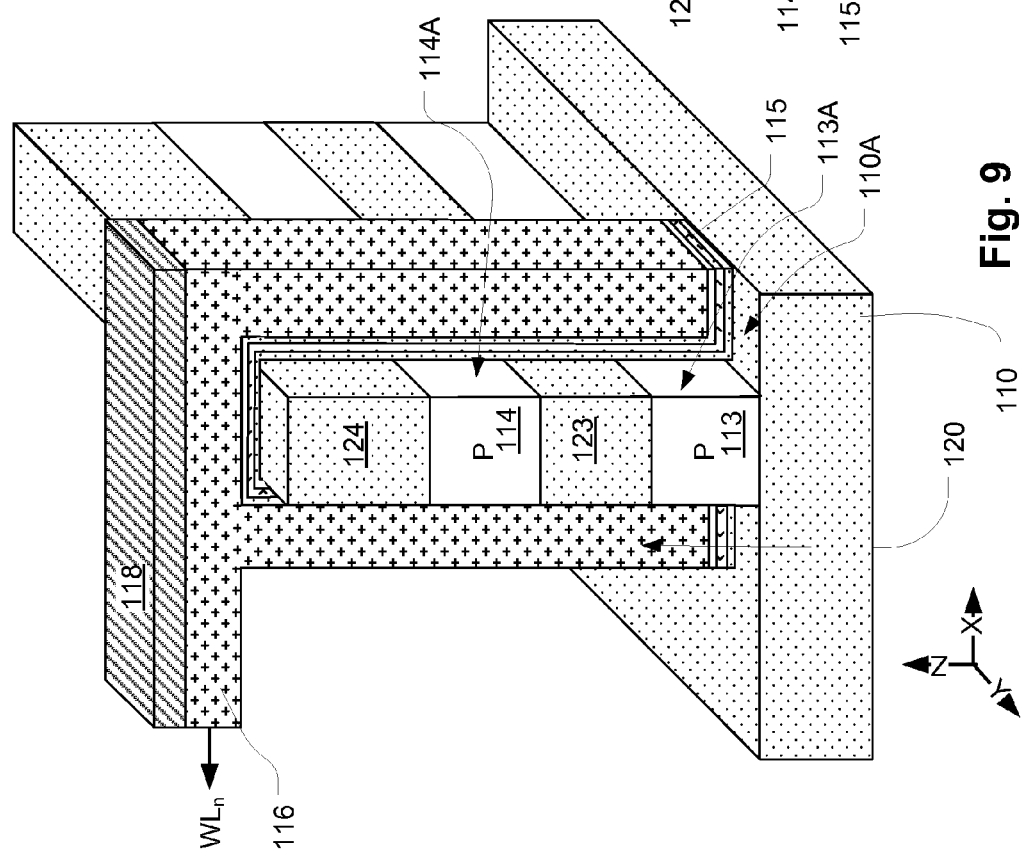
FIG. 9 is a perspective illustration of an alternative implementation of a 3D NOR-flash memory structure like that of FIG. 5, where the memory layer is removed between the word lines.

FIG. 9 is a perspective drawing of an alternative structure like that of FIG. 5. The reference numerals of similar structures are reused in the figure, and not described again. FIG. 9 differs from FIG. 5 in that the surface 110A of the insulating layer 110, and the side surfaces 113A, 114A of the semiconductor strips 113, 114 are exposed between the word lines 116 which act as word lines, as a result of the etch process which forms the word lines. Thus, the layer 115 of memory material can be completely or partially etched between the word lines without harming operation. However, there is no necessity in some structures for etching through the memory layer 115 forming the dielectric charge trapping structures like those described here.

Figure 10:
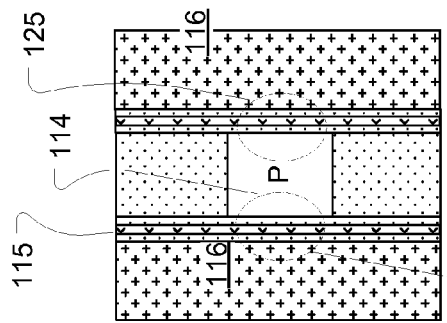
FIG. 10 is a cross-section of a memory cell taken in the X-Z plane from the structure of FIG. 9.
Figure 11:
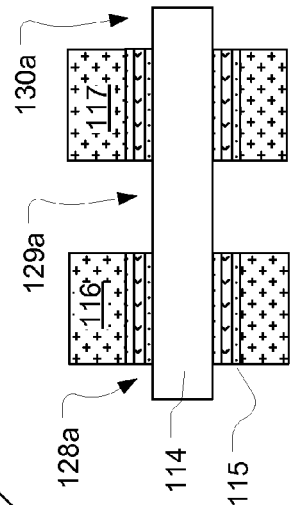
FIG. 11 is a cross-section of a memory cell taken in the X-Y plane from the structure of FIG. 9.

FIG. 10 is a cross-section of a memory cell in the X-Z plane like that of FIG. 6. FIG. 10 is identical to FIG. 6, illustrating that a structure like that of FIG. 9 results in memory cells that are the same as those implemented in the structure of FIG. 5 in this cross-section. FIG. 11 is a cross-section section of a memory cell in the X-Y plane like that of FIG. 7. FIG. 11 differs from FIG. 7 in that the regions 128a, 129a and 130a along the side surfaces (e.g. 114A) of the semiconductor strip 114 may have the memory material removed.

Figure 12:
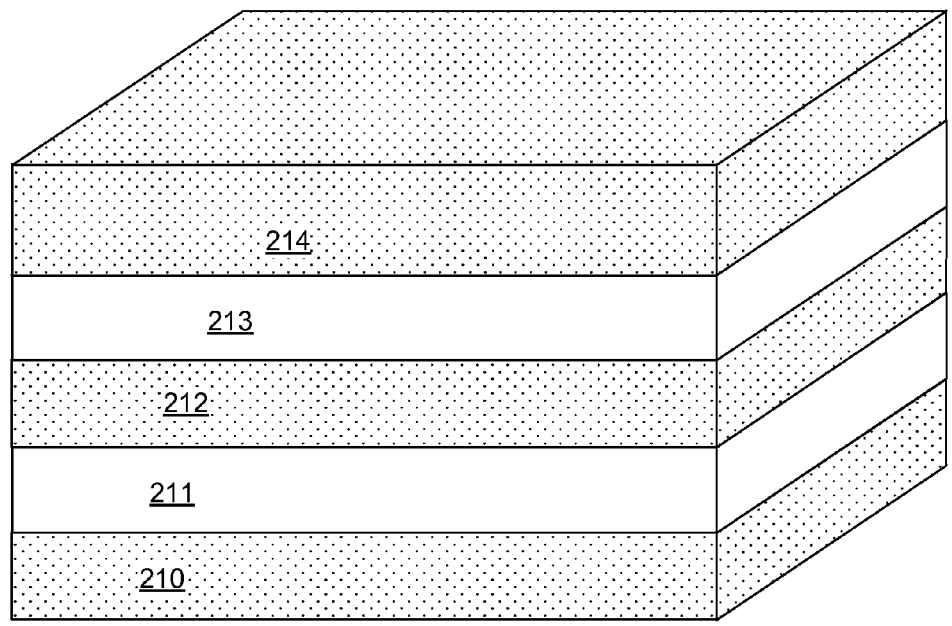
FIG. 12 illustrates a first stage in a process for manufacturing a memory device like that of FIGS. 1, 5 and 9.

FIGS. 12-16 illustrate stages in a basic process flow for implementing 3D memory arrays as described above utilizing only 2 pattern masking steps that are critical alignment steps for array formation. In FIG. 12, a structure is shown which results from alternating deposition of insulating layers 210, 212, 214 and semiconductor layers 211, 213 formed using doped semiconductors for example in a blanket deposition in the array area of a chip. Depending on the implementation, the semiconductor layers 211, 213 can be implemented using polysilicon or epitaxial single crystal silicon having n-type or p-type doping. Inter-level insulating layers 210, 212, 214 can be implemented for example using silicon dioxide, other silicon oxides, or silicon nitride. These layers can be formed in a variety of ways, including low pressure chemical vapor deposition LPCVD processes available in the art.

Figure 13:
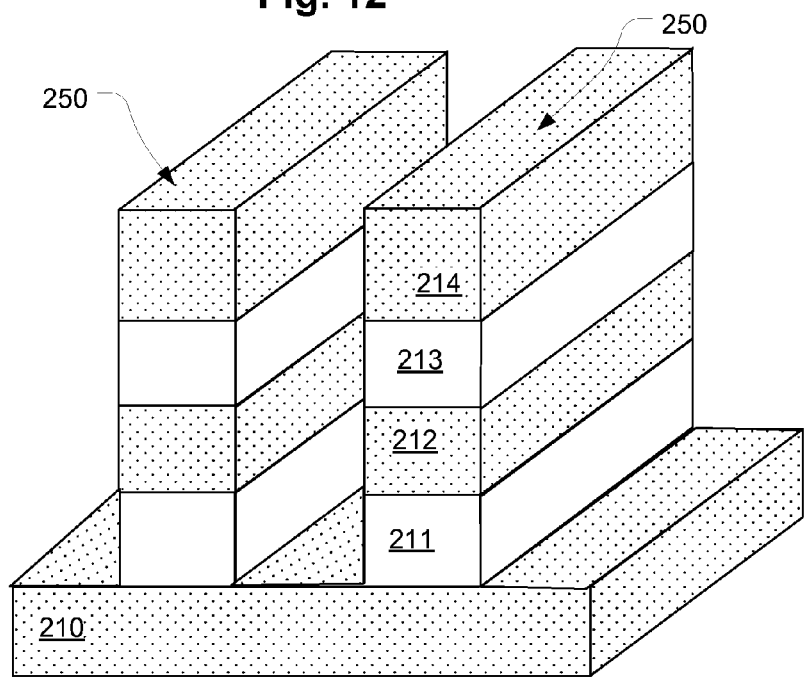
FIG. 13 illustrates a second stage in a process for manufacturing a memory device like that of FIGS. 1, 5 and 9.

FIG. 13 shows the result of a first lithographic patterning step used to define a plurality of ridge-shaped stacks 250 of semiconductor strips, where the semiconductor strips are implemented using the material of the semiconductor layers 211, 213, and separated by the insulating layers 212, 214. Deep, high aspect ratio trenches can be formed in the stack, supporting many layers, using lithography based processes applying a carbon hard mask and reactive ion etching.

Figure 14A:
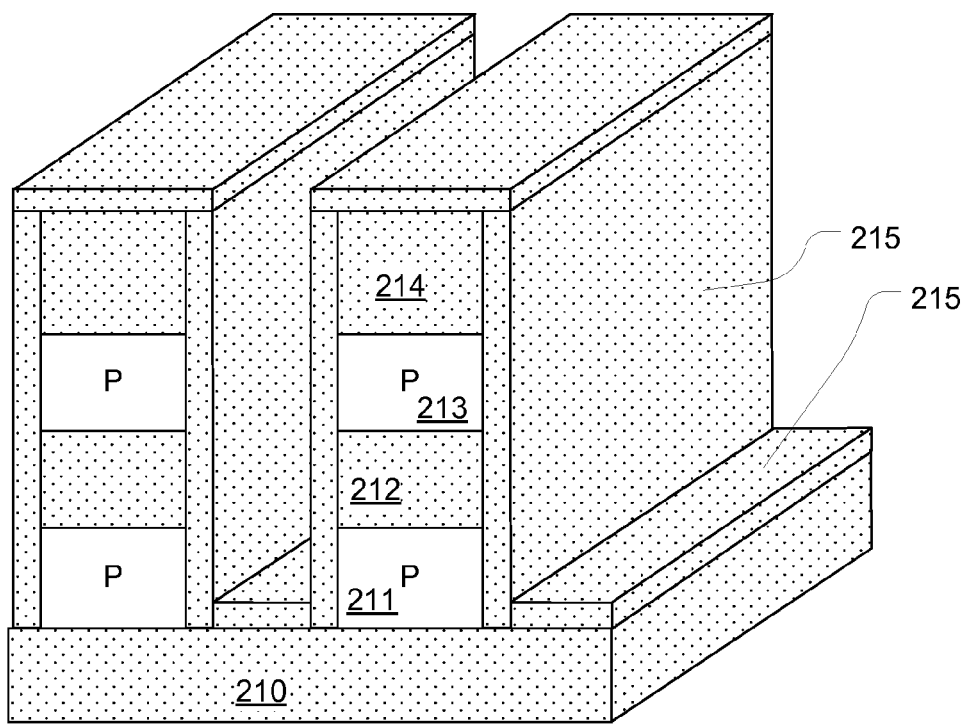
FIG. 14A illustrates a third stage in a process for manufacturing a memory device like that of FIG. 1.
Figure 14B:
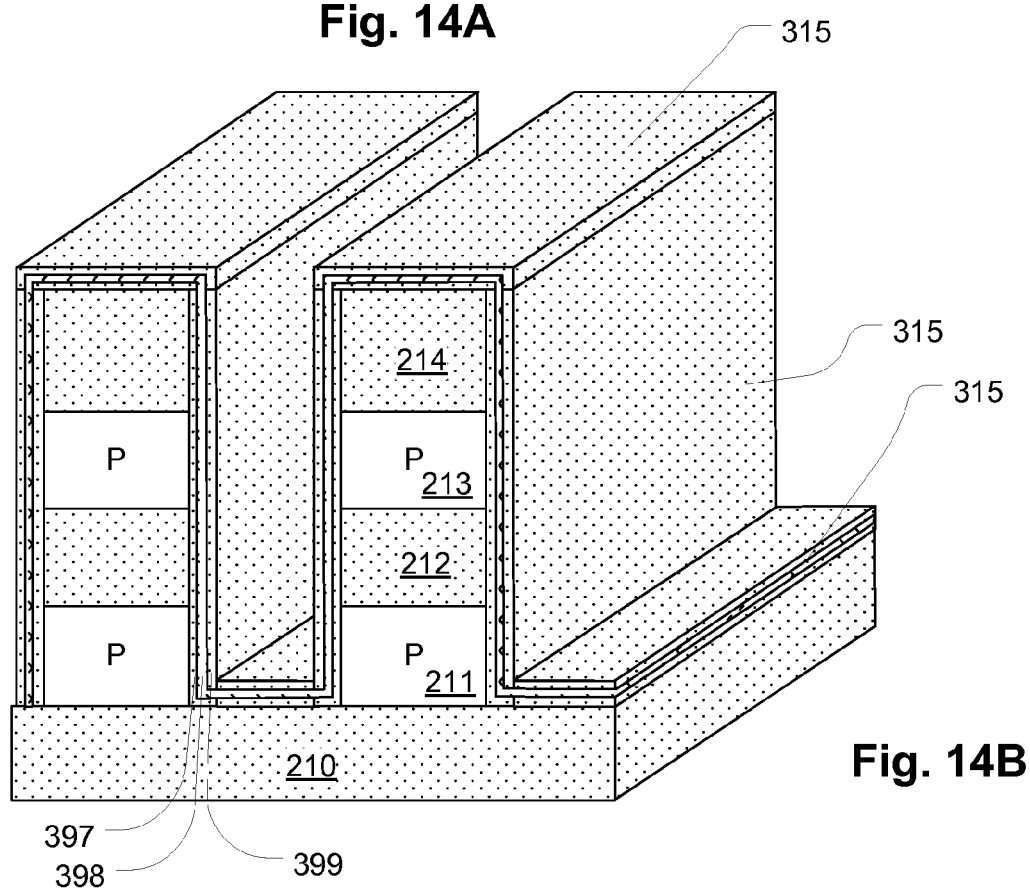
FIG. 14B illustrates a third stage in a process for manufacturing a memory device like that of FIG. 5.

Although not shown, at this step the alternating orientations of the memory strings are defined: the bit line end-to-source line end orientation, and the source line end-to-bit line end orientation FIGS. 14A and 14B show the next stage for, respectively, an embodiment including a programmable resistance memory structure such as an anti-fuse cell structure, and an embodiment including a programmable charge trapping memory structure such as a SONOS type memory cell structure.

FIG. 14A shows results of a blanket deposition of a layer 215 of memory material in an embodiment in which the memory material consists of a single layer as in the case of an anti-fuse structure like that shown in FIG. 1. In an alternative, rather than a blanket deposition, an oxidation process can be applied to form oxides on the exposed sides of the semiconductor strips, where the oxides act as the memory material.

FIG. 14B shows results of blanket deposition of a layer 315 that comprises multilayer charge trapping structure including a tunneling layer 397, a charge trapping layer 398 and a blocking layer 399 as described above in connection with FIG. 4. As shown in FIGS. 14A and 14B, the memory layers 215, 315 are deposited in a conformal manner over the ridge-shaped stacks (250 of FIG. 13) of semiconductor strips.

Figure 15:
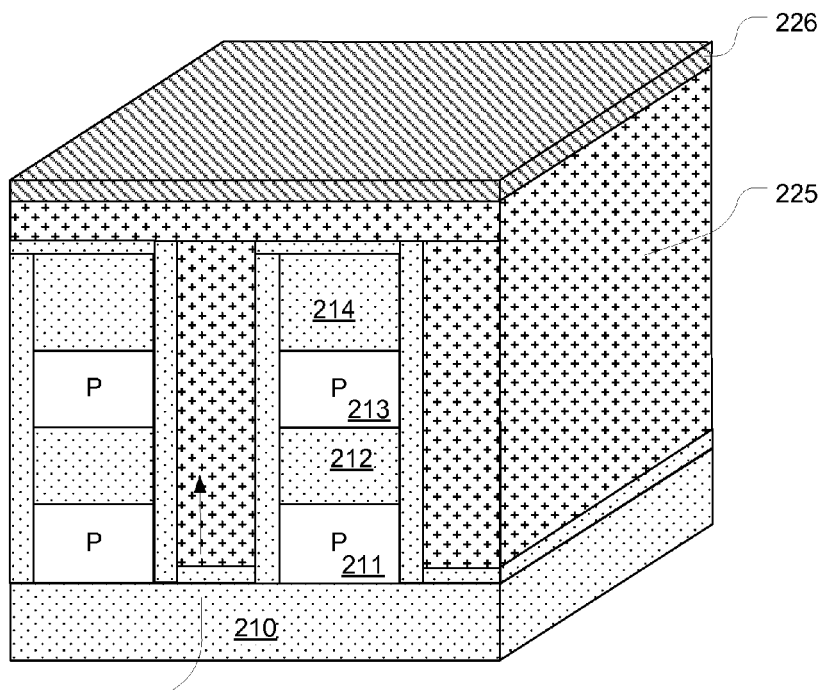
FIG. 15 illustrates a third stage in a process for manufacturing a memory device like that of FIGS. 1, 5 and 9.

FIG. 15 shows the results of a high aspect ratio fill step in which conductive material, such as polysilicon having n-type or p-type doping, to be used for the word lines which act as word lines, is deposited to form layer 225. Also, a layer of silicide 226 can be formed over the layer 225 in embodiments in which polysilicon is utilized. As illustrated in the figure, high aspect ratio deposition technologies such as low-pressure chemical vapor deposition of polysilicon in the illustrated embodiments is utilized to completely fill the trenches 220 between the ridge-shaped stacks, even very narrow trenches on the order of 10 nanometers wide with high aspect ratio.

Figure 16:
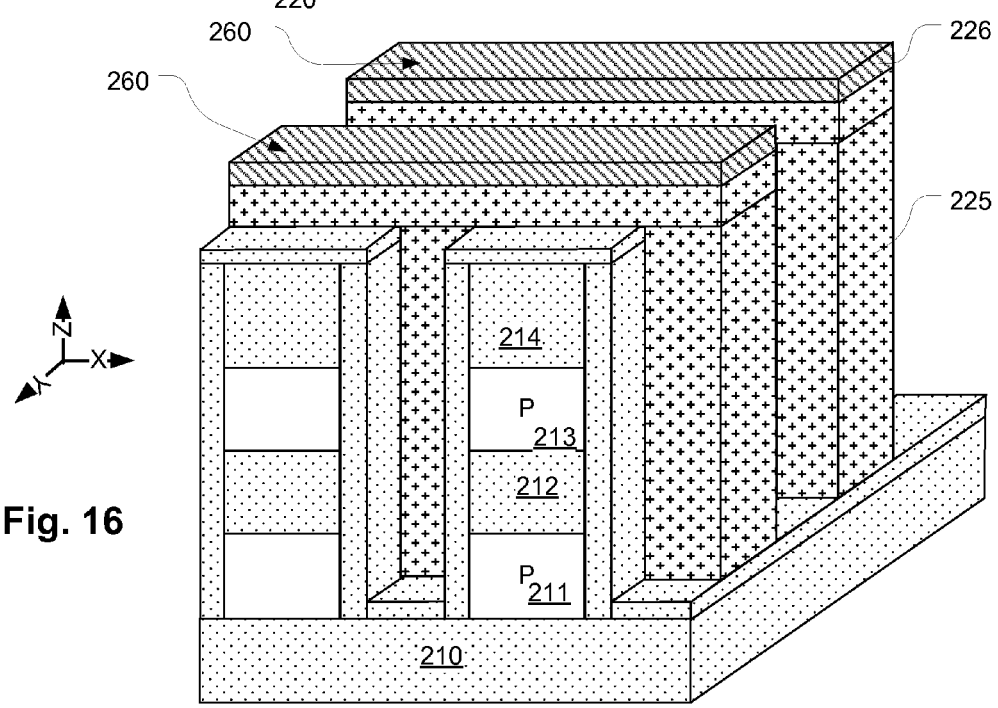
FIG. 16 illustrates a fourth stage in a process for manufacturing a memory device like that of FIGS. 1, 5 and 9, followed by further stages of a hard mask and an optional implant step.

FIG. 16 shows results of the second lithographic patterning step used to define a plurality of word lines 260 which act as word lines for the 3D memory array. The second lithographic patterning step utilizes a single mask for critical dimensions of the array for etching high aspect ratio trenches between the word lines, without etching through the ridge-shaped stacks. Polysilicon can be etched using an etch process that is highly selective for polysilicon over silicon oxides or silicon nitrides. Thus, alternating etch processes are used, relying on the same mask to etch through the conductor and insulating layers, with the process stopping on the underlying insulating layer 210.

At this step, the ground select lines can also be defined. At this step, the gate structures which are controlled by string select lines can also be defined, although the gate structures are conformal to individual semiconductor strip stacks.

An optional manufacturing step includes forming hard masks over the plurality of word lines, and hard masks over the gate structures. The hard masks can be formed using a relatively thick layer of silicon nitride or other material which can block ion implantation processes. After the hard masks are formed, an implant can be applied to increase the doping concentration in the semiconductor strips, and in stairstep structures, and thereby reduce the resistance of the current path along the semiconductor strips. By utilizing controlled implant energies, the implants can be caused to penetrate to the bottom semiconductor strip, and each overlying semiconductor strip in the stacks.

Subsequently, the hard masks are removed, exposing the silicide layers along the top surfaces of the word lines, and over the gate structures. After an interlayer dielectric is formed over the top of the array, vias are opened in which contact plugs, using tungsten fill for example, are formed reaching to the top surfaces of the gate structures. Overlying metal lines are patterned to connect as SSL lines, to column decoder circuits. A three-plane decoding network is established, accessing a selected cell using one word line, one bit line and one SSL line. See, U.S. Pat. No. 6,906,940, entitled Plane Decoding Method and Device for Three Dimensional Memories.

Figure 17:
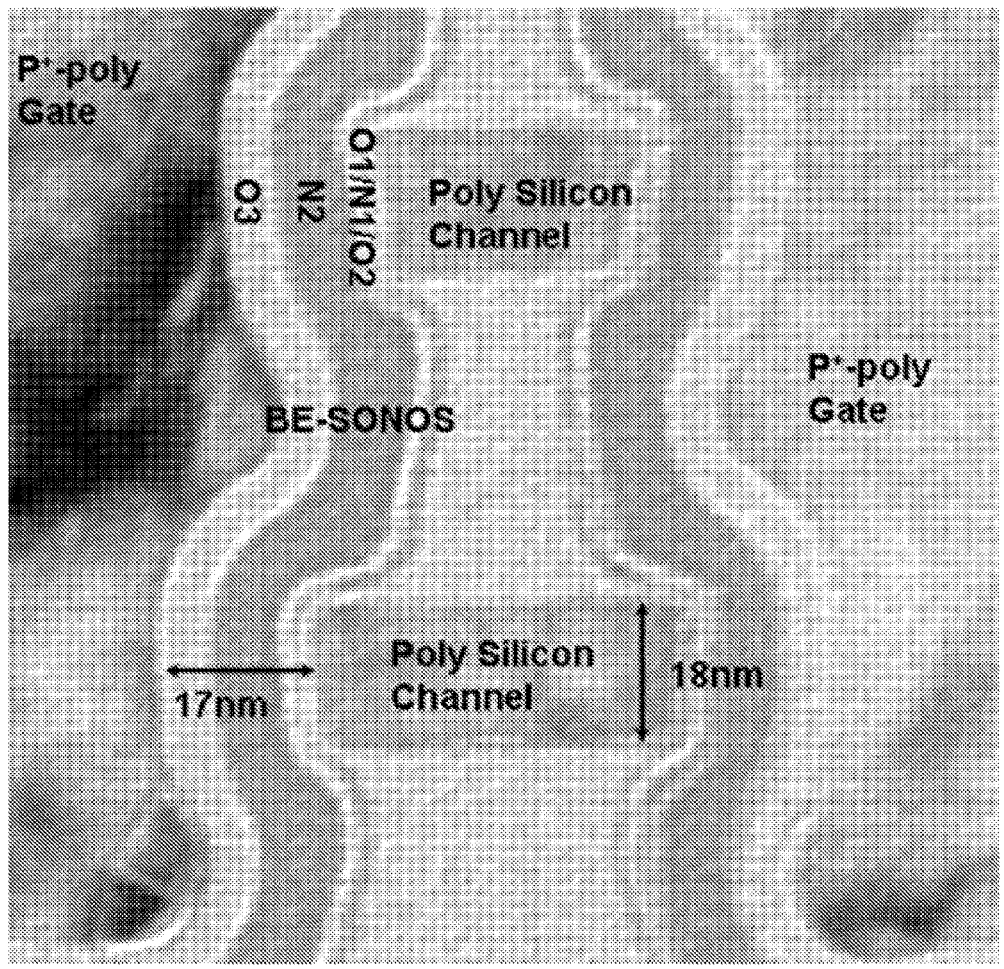
FIG. 17 is a transmission electron microscope TEM image of a portion of 3D flash memory array.

FIG. 17 is a TEM cross-section of a portion of an 8-layer vertical gate, thin-film-transistor, BE-SONOS charge trapping device which has been fabricated and tested. The device was made with a 75 nm half pitch. The channels were n-type polysilicon about 18 nm thick. No additional junction implant was used, resulting in a junction free structure. The insulating material between the strips to isolate the channels in the Z-direction was silicon dioxide was about 40 nm thick. The gates were provided by a p+-polysilicon line. The width of the lower strip is greater than the width of the upper strip because the trench etch used to form the structure resulted in a tapered side wall with progressively wider strips as the trench becomes deeper, and with the insulating material between the strips being etched more than the polysilicon.

Figure 18:
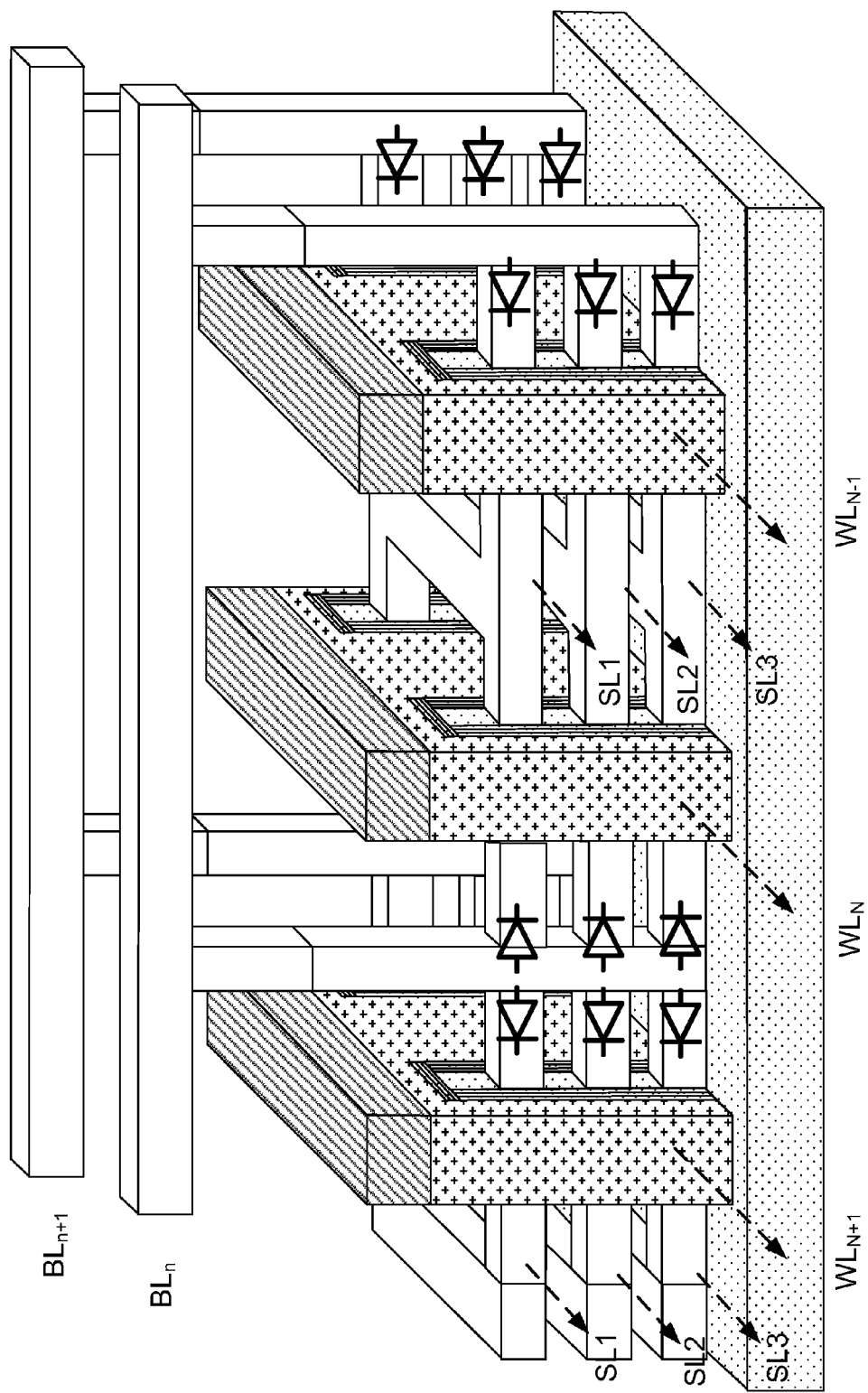
FIG. 18 is a perspective illustration of a 3D NOR-flash memory array structure.

FIG. 18 is a perspective illustration of a 3D NOR-flash memory array structure. Insulating material is removed from the drawing to expose additional structure. For example, insulating layers are removed between the semiconductor strips, in the ridge-shaped stacks, and are removed between the ridge-shaped stacks of semiconductor strips.

The multilayer array is formed on an insulating layer, and includes a plurality of word lines conformal with the plurality of ridge-shaped stacks, and which act as word lines WLn+1, WLn, WLn−1. The number of word lines can be enlarged to the needs of a particular application. The plurality of ridge-shaped stacks each includes semiconductor strips. The number of stacks can be enlarged to the needs of a particular application. Semiconductor strips in the same plane are electrically coupled together by transverse semiconductor strips, which electrically couple to a plurality of source lines. Each plane of semiconductor strips has a corresponding source line voltage. Although a particular plane of semiconductor strips may have multiple transverse source line strips, these strips in the same plane share a common source line voltage. The number of planes can be enlarged to the needs of a particular application.

The stacks of semiconductor strips are coupled to source lines at multiple locations along each of the semiconductor strips. Also, the stacks of semiconductor strips are coupled to bit lines at multiple locations along each of the semiconductor strips. The result is a NOR arrangement, where the position of a word line along a semiconductor strip, is between a source line to one side of the word line, and a bit line contact plug to the other side of the word line. In the shown arrangement, going from left to right, the order of these elements along the semiconductor strip is source line-word line-bit line contact-word line-source line-word line-bit line contact.

A particular word line selects a particular vertical plane of memory cells. A particular source line selects a particular horizontal plane of memory cells. A particular bit line selects a particular stack of semiconductor strips. The threefold combination of word line signals, source line signals, and bit line signals is sufficient to select a particular memory cell from the 3D array of memory cells.

The shown memory unit can be repeated to the right and left, sharing the same bit lines. The shown memory unit can be repeated to the front and back, sharing the same word lines. Also, the shown memory unit can be repeated to the above, to add more planes of semiconductor strips.

Figure 19:
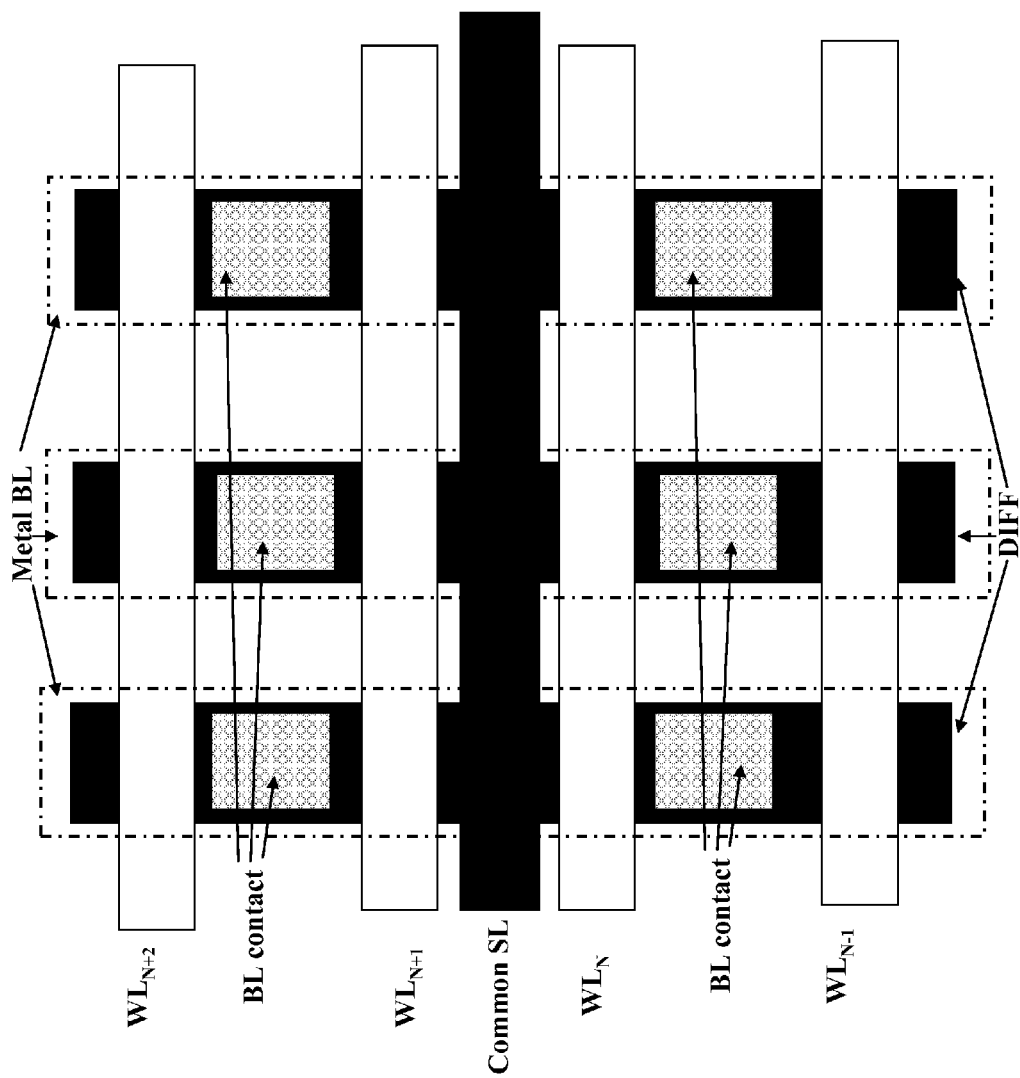
FIG. 19 is a simplified layout illustration of a 3D NOR-flash memory array structure.

FIG. 19 is a simplified layout illustration of a 3D NOR-flash memory array structure. The stacks of semiconductor strips are indicated by DIFF, pointing to the three vertical solid strips. In this case three stacks of semiconductor strips are indicated. Semiconductor strips in the same plane but different stacks are connected by transverse source line strips, indicated by Common SL. Each plane of semiconductor strips has a corresponding source line voltage. A particular source line voltage is coupled to all the transverse source lines of a particular layer of the stack of semiconductor strips, at multiple locations along the stack of semiconductor strips.

Overlying the stacks of semiconductor strips are transverse word lines, indicated by WLN+2, WLN+1, WLN, and WLN−1. The conformal overlap of the word lines with the semiconductor strips indicate the positions of the memory cells. The particular type of the memory cell varies with the particular memory material sandwiched between the word lines and the semiconductor strips. Finally, the bit lines indicated by metal BL are arranged parallel with the semiconductor strips, to overlie the word lines. Each bit line is coupled to all of the layers of a particular stack of semiconductor strips, at multiple locations along the stack of semiconductor strips. These locations are indicated by BL contact.

Figure 20:
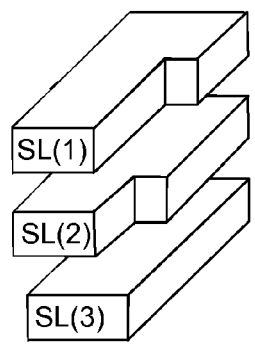
FIG. 20 is an example of a staircase structure to electrically couple the different layers of the 3D memory to different source lines.

FIG. 20 is an example of a staircase structure to electrically couple the different layers of the 3D memory to different source lines. The different steps are indicated as SL(1), SL(2), and SL(3), indicating that each step has a corresponding source line voltage, just as each plane of the stacks of semiconductor strips shares a common source line voltage. The staircase structure connects the different planes of the stacks of semiconductor strips to source line contacts and source lines, then to a decoder.

The staircase structure is coupled to each transverse source line strip. Alternatively, because the transverse source line strips in the same plane share the same source line voltage, a subset of the transverse source line strips has the staircase structure, so long as the transverse source line strips are electrically connected together. These staircase structures are electrically connected to different source lines for connection to decoding circuitry to select planes within the array. The higher steps of the staircase structure remove more material than the lower steps of the staircase structure, so that source line contacts can reach the lower steps without being blocked by the higher steps. These staircase structures can be patterned at the same time that the plurality of ridge-shaped stacks are defined.

Figure 21:
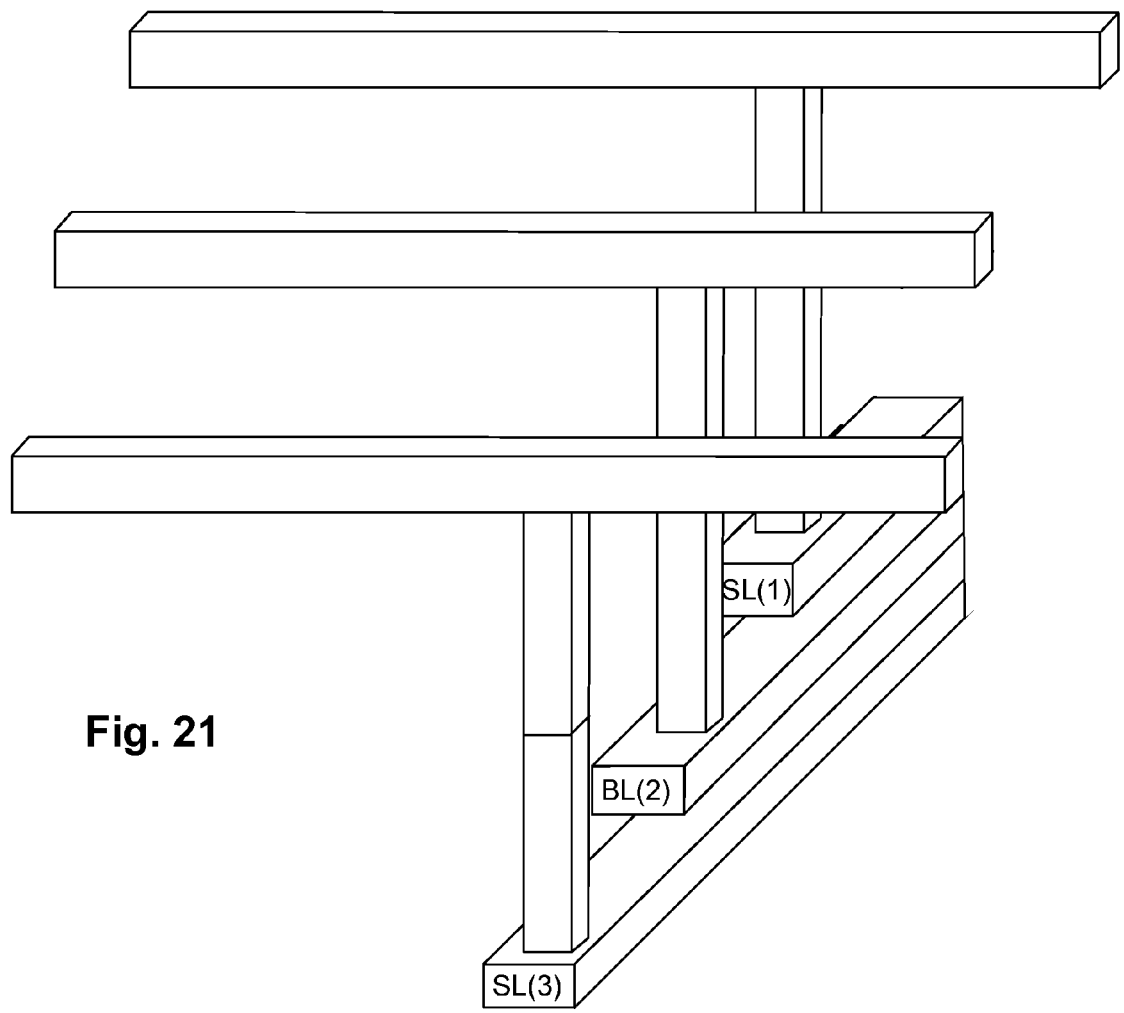
FIG. 21 is another example of a staircase structure to electrically couple the different layers of the 3D memory to different source lines.

FIG. 21 is another example of a staircase structure to electrically couple the different layers of the 3D memory to different source lines.

In contrast with the staircase structure of FIG. 20, the staircase structure of FIG. 21 has extensions which extend away from the 3D array by varying extension lengths. The lower steps of the staircase structure extend by more than the higher steps of the staircase structure, so that source line contacts can reach the lower steps without being blocked by the higher steps.

Figure 22:
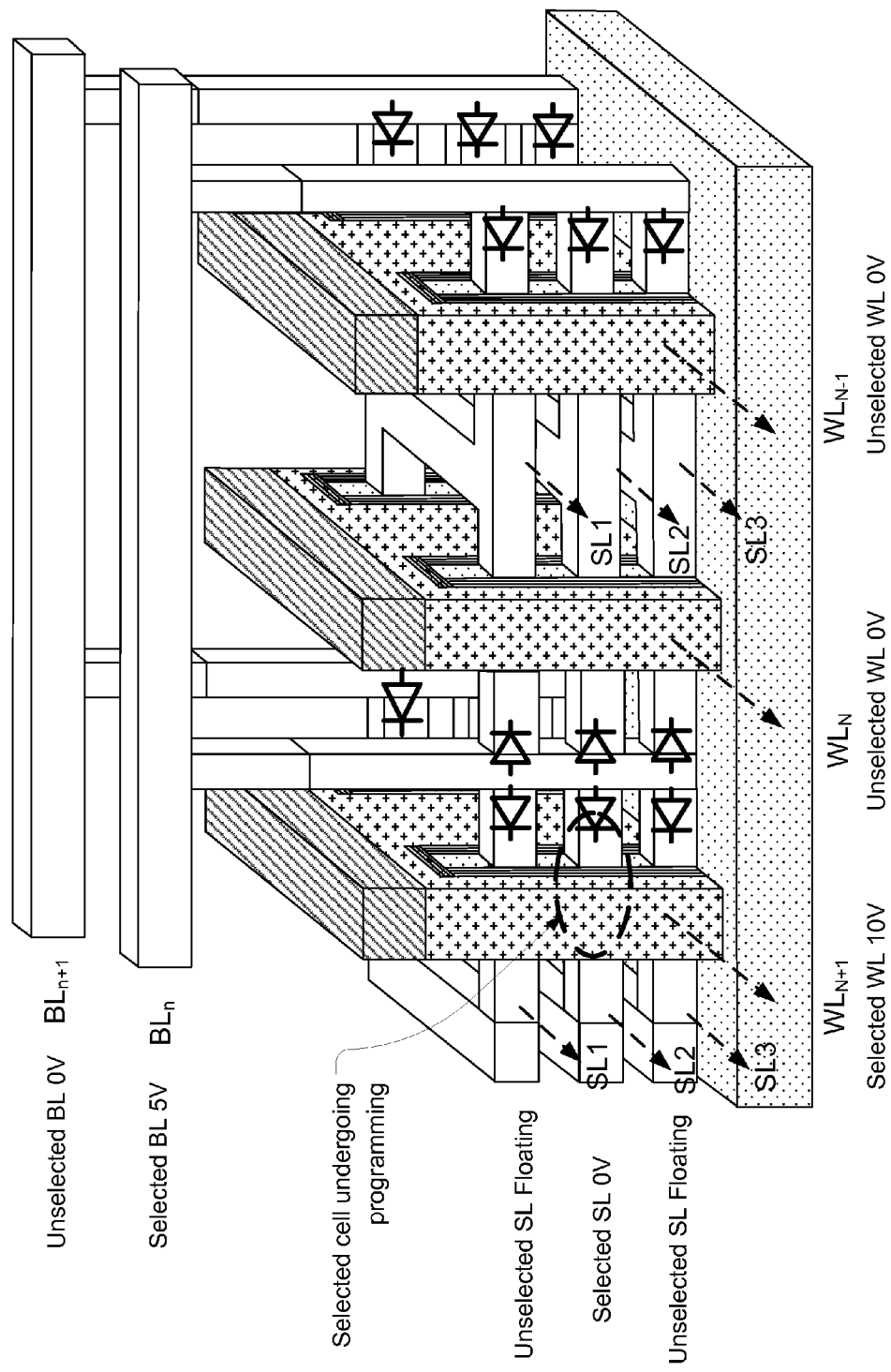
FIG. 22 is the perspective illustration of a 3D NOR-flash memory array structure shown in FIG. 18, undergoing a programming operation on a selected memory cell.
Figure 23:
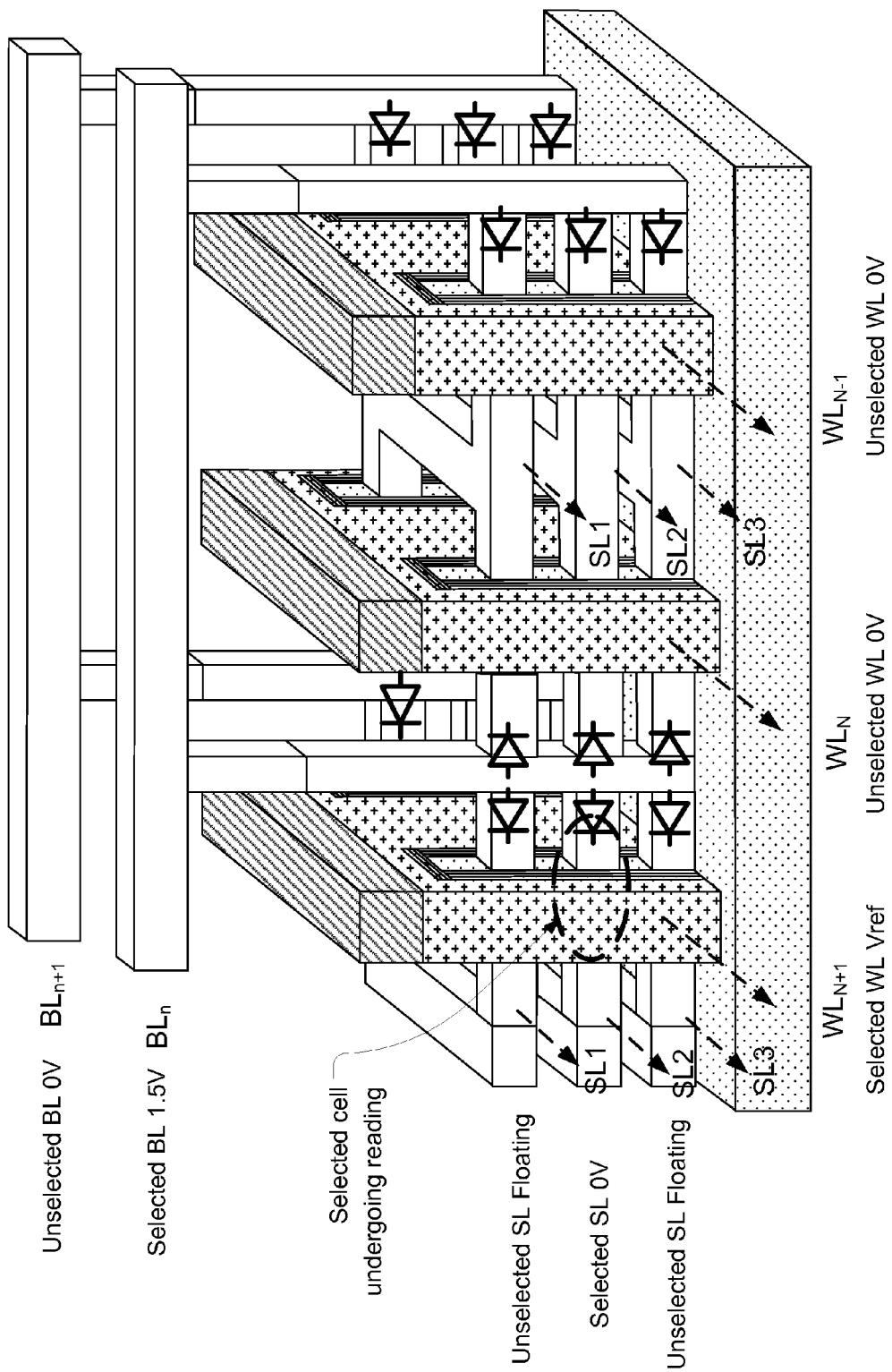
FIG. 23 is the perspective illustration of a 3D NOR-flash memory array structure shown in FIG. 18, undergoing a reading operation on a selected memory cell.
Figure 24:
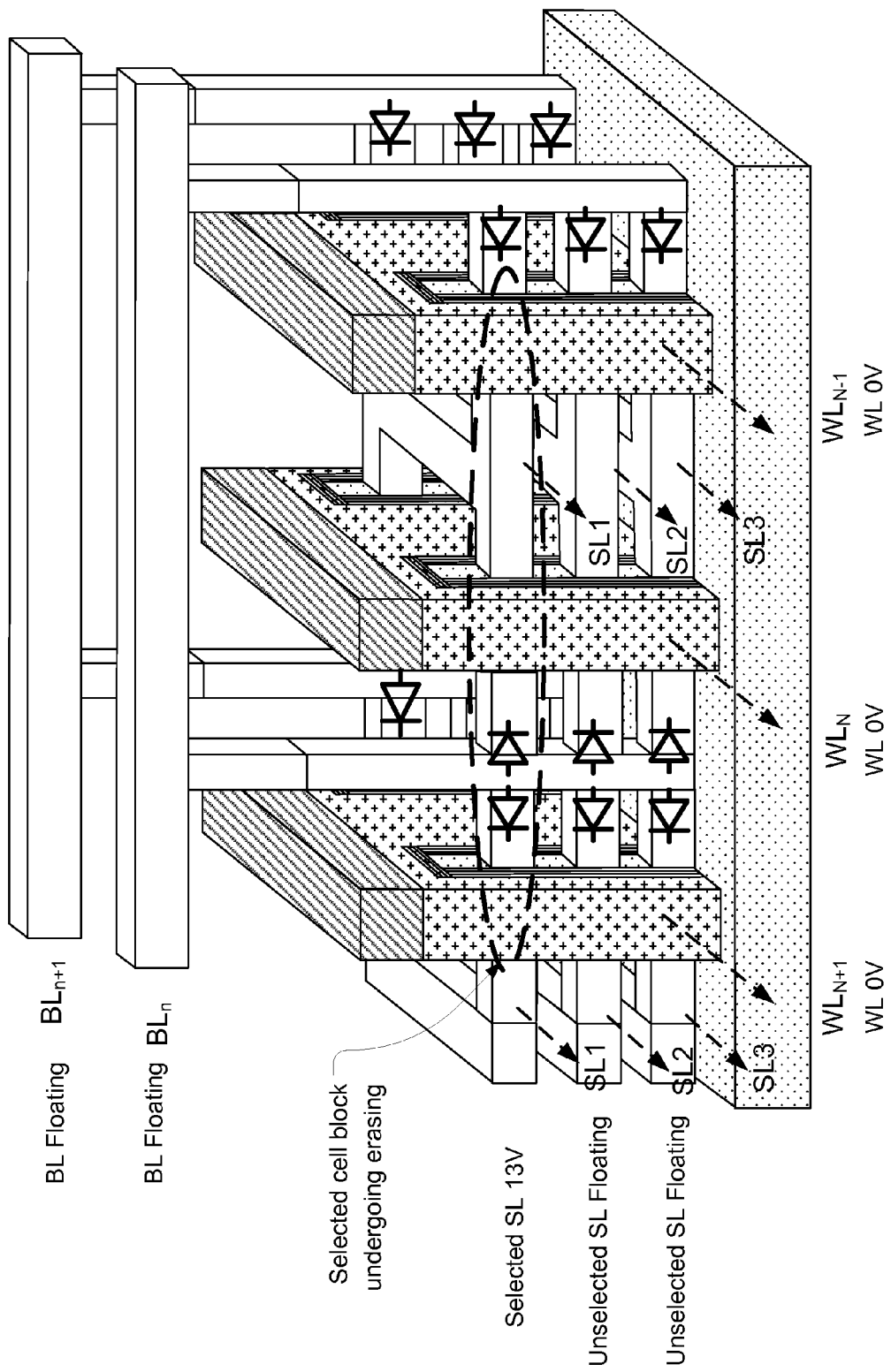
FIG. 24 is the perspective illustration of a 3D NOR-flash memory array structure shown in FIG. 18, undergoing an erasing operation on a selected block of memory cells.

FIGS. 22-24 show example biasing configurations for various operations. The memory cell(s) selected to undergo an operation is indicated with the dashed circle. The bit line, word line, and source line, which correspond to this memory cell are "selected". Other bit lines, word lines, and source lines, which do not correspond to this memory cell, are "unselected".

The shown memory unit can be repeated to the right and left, sharing the same bit lines. The shown memory unit can be repeated to the front and back, sharing the same word lines. Also, the shown memory unit can be repeated to the above, to add more planes of semiconductor strips.

FIG. 22 is the perspective illustration of a 3D NOR-flash memory array structure shown in FIG. 18, undergoing a programming operation on a selected memory cell.

The unselected bit lines are biased at 0V. The selected bit lines are biased at 5V. The unselected source lines are biased to float. The selected source lines are biased at 0V. The unselected word lines are biased at 0V. The selected word lines are biased at 10V.

The indicated bias performs CHE (channel hot electron) programming. Because a diode is formed by the p+ poly plug bit line contact, with the n-type semiconductor strips, stray current paths are eliminated, such as from flowing the selected bit line into an unselected bit line.

FIG. 23 is the perspective illustration of a 3D NOR-flash memory array structure shown in FIG. 18, undergoing a reading operation on a selected memory cell.

The unselected bit lines are biased at 0V. The selected bit lines are biased at 1.5V. The unselected source lines are biased to float. The selected source lines are biased at 0V. The unselected word lines are biased at 0V. The selected word lines are biased at a read reference voltage Vref between the erase and programmed threshold voltages.

The indicated bit line bias is larger than the diode turn-on bias to allow for sufficient read margin. Again, because a diode is formed by the p+ poly plug bit line contact, with the n-type semiconductor strips, stray current paths are eliminated, such as from flowing the selected bit line into an unselected bit line.

FIG. 24 is the perspective illustration of a 3D NOR-flash memory array structure shown in FIG. 18, undergoing an erasing operation on a selected block of memory cells.

The bit lines are biased to float. The unselected source lines are biased to float. The selected source lines are biased at 13V. The word lines are biased at 0V.

The indicated bias performs hole injection for erasing. For unselected memory units, a high positive WL bias helps prevent erase disturb.

In another embodiment, the programming, reading, and erasing bias arrangements of FIGS. 22-24 is performed on a 3D NOR DRAM memory array with volatile memory storage.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
    an integrated circuit substrate;
    a plurality of stacks of semiconductor material strips extending out of the integrated circuit substrate, the plurality of stacks being ridge-shaped and including at least two semiconductor material strips separated by insulating material into different plane positions of a plurality of plane positions;
    a plurality of word lines arranged orthogonally over and being conformal with the plurality of stacks;
    a plurality of memory elements between surfaces of the plurality of stacks and the plurality of word lines;
    a plurality of bit line structures coupled to multiple locations along each of the semiconductor material strips of the plurality of stacks; and
    a plurality of source line structures coupled to multiple locations along each of the semiconductor material strips of the plurality of stacks,
    wherein the plurality of bit line structures and the plurality of source line structures are between adjacent ones of the plurality of word lines.

2. The memory device of claim 1, wherein the plurality of memory elements respectively comprise a tunneling layer, a charge trapping layer and a blocking layer.

3. The memory device of claim 1, wherein the plurality of memory elements support volatile storage.

4. The memory device of claim 1, further comprising diodes, proximate to the plurality of bit line structures.

5. The memory device of claim 1, further comprising diodes, wherein the semiconductor material strips comprise n-type silicon of the diodes, and the diodes comprise a p-type region in the strips.

6. The memory device of claim 1, further comprising diodes, wherein the semiconductor material strips comprise n-type silicon of the diodes, and the diodes comprise a p-type plug in contact with the semiconductor material strips.

7. The memory device of claim 1, wherein a combined selection of a particular one of a plurality of bit lines, a particular one of a plurality of source lines, and a particular one of the plurality of word lines, identifies a particular memory element of the plurality of memory elements.

8. The memory device of claim 1, further comprising:
    staircase structures coupling the plurality of source line structures to a plurality of source lines.

9. A memory device, comprising:
    an integrated circuit substrate;
    a 3D array of memory cells on the integrated circuit substrate, the 3D array including stacks of NOR memory cells, the stacks of NOR memory cells in a plurality of stacks of semiconductor material strips extending out of the integrated circuit substrate, the plurality of stacks being ridge-shaped and including at least two semiconductor material strips separated by insulating material into different plane positions of a plurality of plane positions;
    a plurality of word lines arranged over and being conformal with the stacks of NOR memory cells;
    a plurality of bit lines structures coupled to multiple locations along the stacks of NOR memory cells; and
    a plurality of source line structures coupled to multiple locations along each of the semiconductor material strips of the plurality of stacks,
    wherein the plurality of bit line structures and the plurality of source line structures are between adjacent ones of the plurality of word lines.

10. The memory device of claim 9, wherein the 3D array comprises memory elements in the interface regions that respectively comprise a tunneling layer, a charge trapping layer and a blocking layer.

11. The memory device of claim 9, wherein the 3D array comprises memory elements in the interface regions that support volatile storage.

12. The memory device of claim 9, further comprising diodes, proximate to the plurality of bit line structures.

13. The memory device of claim 9, further comprising diodes, wherein the stacks comprise n-type silicon of the diodes, and the diodes comprise a p-type region in the stacks.

14. The memory device of claim 9, further comprising diodes, wherein the stacks comprise n-type silicon of the diodes, and the diodes comprise a p-type plug in contact with the stacks.

15. The memory device of claim 9, wherein a combined selection of a particular one of a plurality of bit lines, a particular one of a plurality of source lines, and a particular one of the plurality of word lines, identifies a particular memory cell of the 3D array of memory cells.

16. The memory device of claim 9, further comprising:
    staircase structures coupling the plurality of source line structures to a plurality of source lines.

17. A method of manufacturing a memory device, comprising:
    providing an integrated circuit substrate;
    forming a plurality of stacks of semiconductor material strips extending out of the integrated circuit substrate, the plurality of stacks being ridge-shaped and including at least two semiconductor material strips separated by insulating material into different plane positions of a plurality of plane positions;
    forming a plurality of word lines arranged orthogonally over and being conformal with the plurality of stacks;
    forming a plurality of memory elements between surfaces of the plurality of stacks and the plurality of word lines;
    forming a plurality of bit line structures coupled to multiple locations along each of the semiconductor material strips of the plurality of stacks; and
    forming a plurality of source line structures coupled to multiple locations along each of the semiconductor material strips of the plurality of stacks,
    wherein the plurality of bit line structures and the plurality of source line structures are between adjacent ones of the plurality of word lines.

18. A method of manufacturing a memory device, comprising:
    providing an integrated circuit substrate;
    forming a 3D array of memory cells on the integrated circuit substrate, the 3D array including stacks of NOR memory cells, the stacks of NOR memory cells in a plurality of stacks of semiconductor material strips extending out of the integrated circuit substrate, the plurality of stacks being ridge-shaped and including at least two semiconductor material strips separated by insulating material into different plane positions of a plurality of plane positions;
    forming a plurality of word lines arranged over and being conformal with the stacks of NOR memory cells;
    forming a plurality of bit lines structures coupled to multiple locations along the stacks of NOR memory cells; and
    forming a plurality of source line structures coupled to multiple locations along each of the semiconductor material strips of the plurality of stacks
    wherein the plurality of bit line structures and the plurality of source line structures are between adjacent ones of the plurality of word lines.

* * * * *